United States Patent
Ben-Ezra et al.

(10) Patent No.: US 6,701,197 B2
(45) Date of Patent: Mar. 2, 2004

(54) SYSTEM AND METHOD FOR SIDE TO SIDE REGISTRATION IN A PRINTED CIRCUIT IMAGER

(75) Inventors: Barry Ben-Ezra, Ramat-Hasharon (IL); Abraham Gross, Ramat-Aviv (IL); Hanan Gino, Rishon-Lezion (IL); Boris Kling, Rehovot (IL); Dan Alon, Mizpe Yericho (IL)

(73) Assignee: Orbotech Ltd., Yavne (IL)

( * ) Notice: Subject to any disclaimer, the term of this patent is extended or adjusted under 35 U.S.C. 154(b) by 449 days.

(21) Appl. No.: 09/792,498

(22) Filed: Feb. 23, 2001

(65) Prior Publication Data

US 2002/0055789 A1 May 9, 2002

Related U.S. Application Data

(63) Continuation-in-part of application No. 09/708,160, filed on Nov. 8, 2000.

(51) Int. Cl.$^7$ .............................................. G05B 19/18
(52) U.S. Cl. ............................. 700/59; 700/56; 700/58; 700/57; 700/186; 700/195; 700/121; 358/296; 358/300; 358/301; 358/302
(58) Field of Search .................... 700/56, 59, 58, 700/60, 61, 62, 64, 186, 192, 193, 195, 131, 121, 123, 124, 125; 354/296, 300, 301, 302

(56) References Cited

U.S. PATENT DOCUMENTS

| | | | |
|---|---|---|---|
| 4,566,038 A | * | 1/1986 | Dimick .......................... 382/245 |
| 4,680,627 A | * | 7/1987 | Sase et al. ..................... 382/147 |
| 4,894,790 A | * | 1/1990 | Yotsuya et al. ................ 382/147 |
| 5,156,772 A | | 10/1992 | Allan et al. |
| 5,161,202 A | * | 11/1992 | Kitakado et al. ............. 382/147 |
| 5,388,517 A | | 2/1995 | Levien |
| 5,548,372 A | | 8/1996 | Schroeder et al. |
| 5,643,699 A | | 7/1997 | Waldner |
| 5,768,443 A | | 6/1998 | Michael et al. |
| 5,856,844 A | | 1/1999 | Batterman et al. |
| 5,980,088 A | | 11/1999 | Iwasaki et al. |
| 6,064,757 A | | 5/2000 | Beaty et al. |
| 6,165,658 A | * | 12/2000 | Taff et al. ..................... 430/30 |
| 6,205,364 B1 | | 3/2001 | Lichtenstein et al. |
| 6,246,789 B1 | | 6/2001 | Hosotani et al. |
| 6,449,516 B1 | | 9/2002 | Kyomasu et al. |
| 6,567,713 B2 | * | 5/2003 | Lichtenstein et al. ......... 700/58 |

FOREIGN PATENT DOCUMENTS

| | | |
|---|---|---|
| CN | ROC 247392 | 5/1995 |
| GB | 2 288 229 | 10/1995 |
| WO | WO 00/02424 | 1/2000 |

OTHER PUBLICATIONS

US 2002/0015165 A1, Taka et al., Feb. 7, 2002, Image Forming Apparatus.*
Brochure from the BARCO corporation, titled "Gemini Laser Direct Imaging, a Profitable Reality for Your Shop;" copyright 2000.

* cited by examiner

Primary Examiner—Ramesh Patel
(74) Attorney, Agent, or Firm—Fenster & Company

(57) ABSTRACT

A method of recording aligned images on two sides of a printed circuit board substrate, including: recording an image of an electrical circuit pattern on a first side of a printed circuit board substrate; forming an alignment pattern on a side of the printed circuit board substrate, wherein the alignment pattern has a known spatial relationship to said image of an electrical circuit pattern; determining a location of the alignment pattern on the printed circuit board substrate; and recording an image of an electrical circuit pattern on a second side of the printed circuit board substrate in response to the determined location of the alignment pattern.

46 Claims, 18 Drawing Sheets

SYSTEM AND METHOD FOR SIDE TO SIDE REGISTRATION IN A PRINTED CIRCUIT IMAGER

RELATED APPLICATIONS

This application is a continuation in part of U.S. patent application Ser. No. 09/708,160 filed Nov. 8, 2000.

FIELD OF THE INVENTION

The present invention is related to the field of printed circuit board fabrication and especially to the field of fabrication of double sided printed circuit boards.

BACKGROUND OF THE INVENTION

PCT patent publication WO 00/02424, the disclosure of which is incorporated herein by reference, describes a scanning laser direct imaging (LDI) system for writing an electric circuit pattern on a printed circuit board substrate.

FIG. 1 is a reproduction of FIG. 1 of the above referenced publication. Some details of its operation are given below. Further details of the operation and an explanation of the figure can be found in the publication. In such systems, a laser beam or beams, modulated with pattern data, is scanned across a sensitized printed circuit board substrate 78 to write a latent image of a desired electrical circuit pattern.

The substrate is optionally inverted and a second pattern in side to side alignment with the first pattern is written on the other side of the substrate. In accordance with some printed circuit board fabrication techniques, substrate layers may be sequentially laminated to previously produced substrate layers and an electrical circuit pattern is written on the outermost side of each sequentially added layer in a build up fashion. The latent patterns are developed to form etching masks on the substrate. The masked substrate is etched to form the desired electrical circuit pattern.

Among the problems which arise in printed circuit board fabrication is the side to side alignment of printed circuit patterns on various substrate layers, and mutual alignment among patterns printed on various substrate layers. One method utilized to obtain suitable alignment is disclosed in the embodiment of FIGS. 1, 2, 14, 15 and 16, of the publication (FIG. 2 is a reproduction of FIG. 14 of the above referenced publication.). PC board substrate 78 is formed with a plurality of holes 150 at least some of which are preferably aligned, at least roughly, in the scan direction. A base on which the substrate is mounted is formed with openings larger than the holes in the substrate and the holes in the substrate are positioned generally in correspondence to the openings in the base. One or more detectors 152 are positioned below the scan line of the scanner.

As the printed circuit board is transported past the scan line, the scanner scans across the holes in a substrate layer. Based on signals detected by detector 150 via the holes and the openings, the locations of the holes in the substrate layer with respect to the scanner are detected. The base is optionally rotated and scanning of the printed circuit board substrate then commences with the position of the scanning lines pattern being referenced to the location of the holes.

It should be noted that the position of the scanning beam that passes through holes 150 is scanned together with another beam that impinges a scale 80 that is used to determine the true instantaneous (scan dimension) position of the beam in the scan direction. Furthermore, the relative cross-scan position of the holes (and thus the board) is determined utilizing a second scale, typically operatively associated with the base.

When scanning the second side of the substrate, the procedure is repeated to determine the position of the holes and thus the position of the already scanned pattern on the first side of the substrate (or the position of already scanned patterns on lower layers in a build up board) with respect to the coordinate space of the LDI system. This allows for the data in the scanning of each subsequent side to be aligned with respect to previously scanned sides.

Optionally, an additional series of holes in the board and pins on the base, or a guide rail along the base, may be used for rough alignment of the substrate. Such pins are shown in FIG. 16 of the reference. In some conventional systems, only such mechanical means are used for aligning the patterns on the two sides of the substrate. The system may include means for rotating the board to improve alignment.

Measuring systems employing imagers, and especially CCD cameras, are known in the art for use in determining the positioning of a PC board in an LDI scanner. Generally, such cameras may be used to detect various markings on a printed circuit board laminate layer, or to detect an edge of a printed circuit board laminate layer and to relate the detected position of the marking or the edge with a scanner position.

SUMMARY OF THE INVENTION

An aspect of some embodiments of the invention is concerned with alignment of the images written on two sides of a PC board.

In exemplary embodiments of the invention, no holes need be made in the printed circuit board in order to provide alignment of the images on both sides.

In some embodiments of the invention, an alignment pattern is written on a first side of the board while an image is written on another side with a scanner in predetermined orientation in relation to the alignment pattern. The scanner used to write the image is provided with at least one detector which can detect the position of the alignment pattern, when the PC board is flipped over. The position of the detector or detectors with respect to the scanner beam is precalibrated relative to the scanner, so that knowledge of the location of the alignment pattern defines the position of the already written image (on the first side now facing away from the scanner) with respect to the scanning system. The at least one detector can be, for example, at least one camera which views the alignment pattern when the PC board is flipped over. This allows for the alignment of the image to be written on the second side with that already written on the first side.

Optionally, the cameras are mounted on a calibrated rail system that allows for at least limited motion of the cameras in the cross scan direction. This allows the at least one camera to move so that it can image the alignment pattern. The provision of this motion is desirable (but not always required) to accommodate the inexact positioning of the PC board when it is flipped over.

Alternatively or additionally, the scanner is equipped with at least one additional camera or other imager, that can view the alignment pattern before flipping the PC board. Such a system is described in Applicant's copending U.S. patent application Ser. No. 09/708,160 filed Nov. 8, 2000, the disclosure of which is incorporated herein by reference. This document describes a system by which an alignment pattern, such as that described above, is imaged and the location of the scanned image is determined with respect to the camera system. Use of such a system helps to calibrate the locations of images determined by the cameras that view the flip side of the PC board with the scanner.

Alternatively or additionally, the positional relationship between the cameras that view the two sides of the PC board is determined by providing a substrate with holes that can be imaged from both sides of the board. This allows for the determination of a transformation between the coordinate systems of the cameras that view both sides. One non-limiting method for accurate determination of the positions of the holes in the coordinate systems is described, for example in PCT publication WO 00/02424, the disclosure of which is incorporated herein by reference.

In other embodiments of the invention, an alignment pattern is written on the second side of the board at the same time as the scanner image is being written on the first side of the board. This pattern can be provided by a fixed or movable source, for example a light source that writes a reticule on the second side. This alignment pattern is thus in alignment with the image written on the first side. When the PC board is turned over, the alignment pattern is imaged by at least one detector (such as at least one camera) that views the same side of the board that is available for scanning (writing) by the scanner. The scanner is pre-calibrated with the cameras (for example utilizing one of the methods described in the above referenced U.S. Ser. No. 09/708,160, so that determining the location of the alignment pattern allows for the writing of the image on the second side in alignment with that written on the first side.

The source may be fixed or, alternatively, may include a light guide, which provides light along a substantial extent in the cross-scan direction. A master plate with a pattern of holes may be provided between the guide and the underside of the PC board, such that the hole pattern is written on the second side of the board. This pattern may be varied to suit the extent of the board.

It should be understood that there are three different elements, in three coordinate systems, which must be referenced to each other. On of these is the scanner and its associated reference system. The second is the cameras and their associated reference system. The third is the alignment pattern writer on the reverse side of the board, which is not in either coordinate system. Exemplary, non-limiting methods for deriving a transformation between the coordinate systems of the scanner and the cameras are given in the above referenced U.S. Ser. No. 09/708,160. Other suitable methods can also be used.

The alignment pattern writer can be referenced to the cameras in a number of ways. One exemplary way is to provide a ground glass at the position of the back of the PC and to image the pattern with the cameras. Thus, the position of the patterns in the camera coordinates can be determined. Then, when an image is written by the scanner and a simultaneous alignment pattern is written on the reverse side, the relationship between the two may be easily determined. Alternatively, the pattern may be directly imaged without the presence of a ground glass. Imaging of the alignment pattern, by the cameras, after turning over the PC board, allows for the positioning of the new image written by the scanner referenced to the image on the first side.

There is thus provided, in accordance with an exemplary embodiment of the invention, a method of recording aligned images on two sides of a printed circuit board substrate, comprising:

recording an image of an electrical circuit pattern on a first side of a printed circuit board substrate;

forming an alignment pattern on a side of the printed circuit board substrate, wherein said alignment pattern has a known spatial relationship to said image of an electrical circuit pattern;

determining a location of the alignment pattern on the printed circuit board substrate; and recording an image of an electrical circuit pattern on a second side of the printed circuit board substrate in response to the determined location of the alignment pattern.

Optionally, determining includes imaging the alignment pattern with at least one imager.

Optionally, forming an alignment pattern on a side of the printed circuit board substrate includes forming the alignment pattern on the first side of the printed circuit board substrate. Additionally or alternatively, forming an alignment pattern on a side of the printed circuit board substrate optionally includes forming the alignment pattern on the second side of the printed circuit board substrate. Additionally or alternatively, forming an alignment pattern on a side of the printed circuit board substrate optionally includes forming the alignment pattern at least partially simultaneously while said image of an electrical circuit pattern is being recorded.

In an embodiment of the invention, forming an alignment pattern on a side of the printed circuit board substrate comprises:

providing a photosensitive coating that is formulated to produce a visible image when exposed to light of a predetermined wavelength; and selectively exposing said photosensitive coating with light of said predetermined wavelength.

Optionally, the photosensitive coating is a photoresist applied to a surface of said printed circuit board substrate. Optionally alternatively or additionally the photosensitive coating is a photosensitive label applied to a surface of said printed circuit board substrate.

Optionally, forming an alignment pattern comprises providing a physical marking on said printed circuit board substrate.

In an embodiment of the invention, selectively exposing comprises selectively exposing using a light source different from a light source used to record said image of an electrical circuit pattern.

Optionally, the light source provides patterned light to said second side of the printed circuit board while the image on the first side is being recorded.

In an embodiment of the invention, selectively exposing comprises selectively exposing said photosensitive coating with light provided by light beam that is employed to record at least part of an electrical circuit image pattern on printed circuit board substrate.

In an embodiment of the invention, selectively exposing comprises exposing said photosensitive surface through a mask.

Optionally, the alignment pattern is formed while the first side is in an orientation in which the image thereon is written.

In an embodiment of the invention, the alignment pattern is formed on said second side.

In an embodiment of the invention, selectively exposing comprises selectively exposing said photosensitive coating with light provided by light beam split off from said light beam that is employed to record at least part of an electrical circuit image pattern on printed circuit board substrate. Optionally, the alignment pattern is formed while the first side is in an orientation in which the image thereon is written. Optionally, the alignment pattern is formed on said second side. Optionally, the alignment pattern is formed simultaneously with the image.

Optionally, the predetermined wavelength is in the UV spectrum.

In an embodiment of the invention, the recording an image of an electrical circuit pattern includes:

providing said printed circuit board substrate coated with a photosensitive coating; and scanning said printed circuit board substrate coated with a photosensitive coating with a modulated laser beam.

Optionally, determining a location comprises:

determining a relationship between a coordinate system of a system for recording an image of an electrical circuit pattern and a coordinate system of an imager for viewing a side of said printed circuit board substrate board;

determining a location of the alignment pattern in the coordinate system of said imager; and determining a location of the alignment pattern in the coordinate system of said system for recording an image of an electrical circuit pattern in response to said relationship.

In an embodiment of the invention, determining a location of the alignment pattern formed on the second side of the printed circuit board substrate comprises:

recording a visible alignment pattern on a second side of a substrate;

determining a spatial relationship between said visible alignment pattern and a location addressed by a pattern recording system;

inverting said substrate;

determining a post inversion position of said location addressed by said pattern recording system;

imaging said visible alignment pattern with an imager to determine a post inversion position of said visible alignment pattern;

calculating the position of said alignment pattern in response to indications of said location, said post-inversion position of said location and said post inversion position of said alignment pattern.

Optionally, determining the first spatial relationship comprises determining the location of at least one hole formed in a substrate.

In an embodiment of the invention, the at least one imager comprises a single imager. Alternatively, the at least one imager comprises a plurality of imagers. Optionally, the at least one imager is fixed in position. Alternatively, the at least one imager is moveable and including means for determining its position.

There is further provided, in accordance with an embodiment of the invention, a method for determining a position whereat a pattern is formed on a first side of a substrate relative to a position on a second side of the substrate, comprising:

forming a pattern on a first side of a substrate;

determining a position of at least one location on a substrate when said substrate is in a first spatial orientation at which the pattern is formed on the first side of the substrate;

inverting said substrate;

determining a position of said at least one location when said substrate is inverted:

sensing a position of said pattern when said substrate is inverted; and calculating the position of said pattern on said first side of said substrate in response to inputs including: the position of said location when said substrate is in said first orientation, the position of said location when said substrate is inverted, and the position of said pattern when said substrate is inverted.

Optionally, said forming includes exposing a pattern in a photosensitive coating disposed on said substrate.

Optionally, the said pattern is visible without developing said photosensitive coating.

In an embodiment of the invention, the location is a hole in said substrate.

There is further provided, in accordance with an embodiment of the invention, a method according to claim 32 wherein said determining a position of said at least one location includes addressing said location with a beam of light;

sensing the presence of the beam of light at said address; and determining the position of the beam of light at said address.

Optionally, sensing includes imaging said pattern with an imager.

There is further provided, in accordance with an embodiment of the invention, apparatus for forming an images on first and second sides of a printed circuit board substrate, comprising:

a scanner adapted to form a first image of an electrical circuit pattern on a first side of the substrate when the substrate is placed thereon in a first orientation;

means for forming an alignment pattern on the first side or the second side, said alignment pattern having a known spatial relationship to said electrical circuit pattern;

an imager that views the alignment pattern when the substrate is inverted and generates an alignment pattern image information; and a controller that receives the alignment pattern image information and controls the scanner to form a second image on the second side, said second image being aligned with said first image, by the controller, responsive to the alignment pattern image information.

Optionally, the imager views the first side of the substrate when the substrate is in the first orientation. Optionally, the alignment pattern is formed on the second side of the substrate, when the substrate is in the first orientation. Optionally, the apparatus includes an optical system that directs light from the scanner to the second side to form the alignment pattern.

Optionally, the apparatus includes a source of radiation positioned and operative to irradiate the second side with patterned light.

Optionally, the imager views the second side of the substrate when the substrate is in the first position. Optionally, the alignment pattern is written on the first side of the substrate, when the substrate is in the first orientation. Optionally, the controller controls the scanner to write the alignment pattern on the first side.

In some embodiments, the apparatus includes a memory in which a relationship between a coordinate system of the imager and a coordinate system of the scanner is recorded, said relationship being utilized by the controller to control the alignment of the second image.

In some embodiments, the apparatus includes a memory in which a spatial relationship between the patterned light generator and the coordinate system of the imager is recorded, said relationship being utilized by the controller to control the alignment of the second image.

In some embodiments, the apparatus includes a memory in which a spatial relationship between the patterned light generator and the coordinate system of the scanner is recorded, said relationship being utilized by the controller to control the alignment of the second image.

There is further provided a method for forming an images on first and second sides of a printed circuit board substrate, comprising:

recording a first image of an electrical circuit pattern on a first side of the substrate, by scanning, when the substrate is in a first orientation;

forming an alignment pattern on the first side or the second side, said alignment pattern having a known spatial relationship to said electrical circuit pattern;

inverting the substrate;

imaging the alignment pattern when the substrate is inverted and generating alignment pattern image information;

determining a position and orientation for scanning a pattern to record a second electrical circuit pattern on the second side, at which the position and orientation the first and second electric circuit patterns are aligned, responsive to the known spatial relationship and the alignment pattern information;

recording a second image of an electrical circuit pattern on the second side, by scanning, responsive to said determination.

BRIEF DESCRIPTION OF THE DRAWINGS

Exemplary embodiments of the invention are described in the following sections with reference to the drawings. The figures are generally not to scale and the same or similar reference numbers are used for the same or related features on different drawings.

DETAILED DESCRIPTION OF EXEMPLARY EMBODIMENTS

Figure 3:
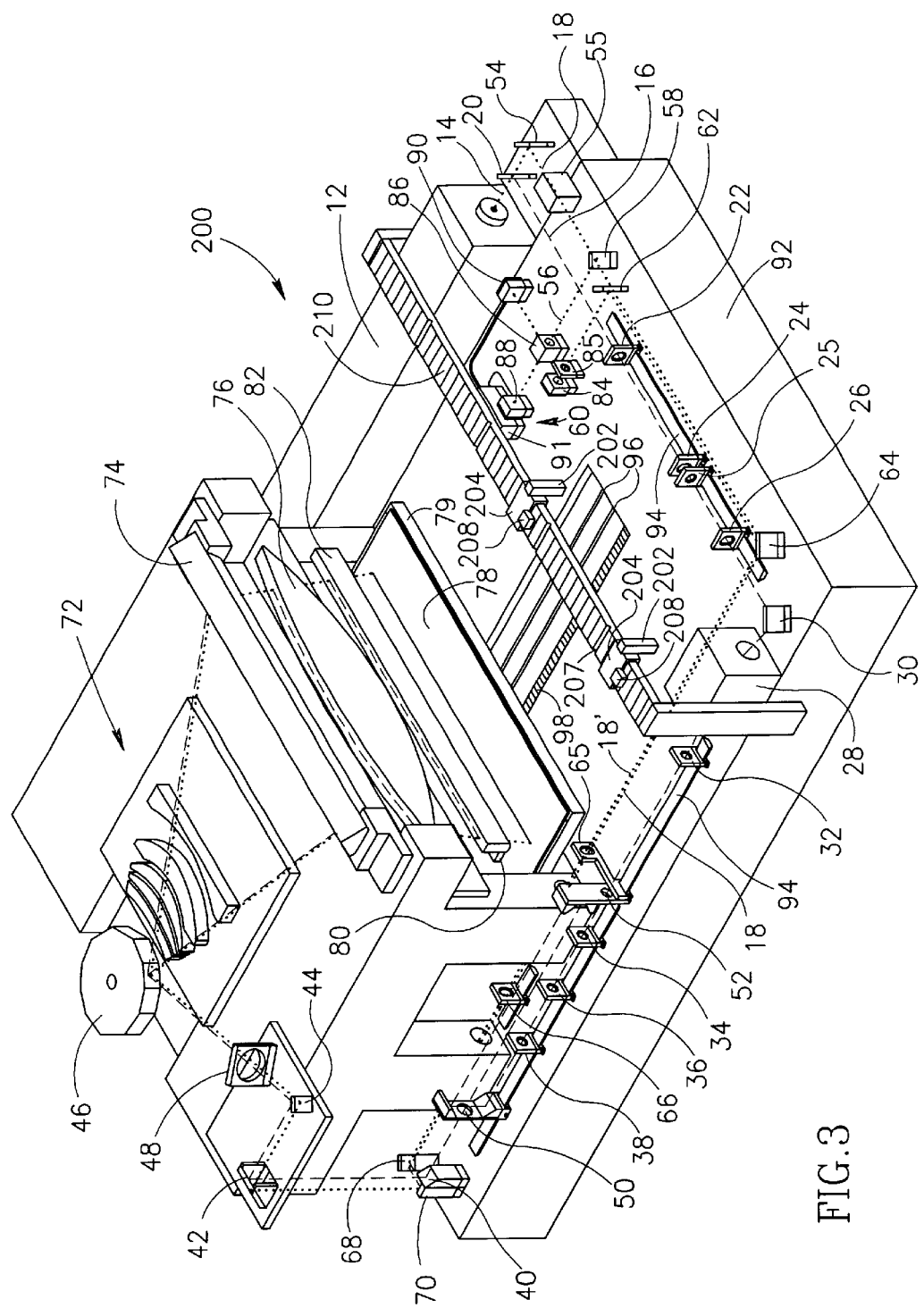
FIG. 3 shows a perspective drawing of a scanner in accordance with an embodiment of the invention.
Figure 4:
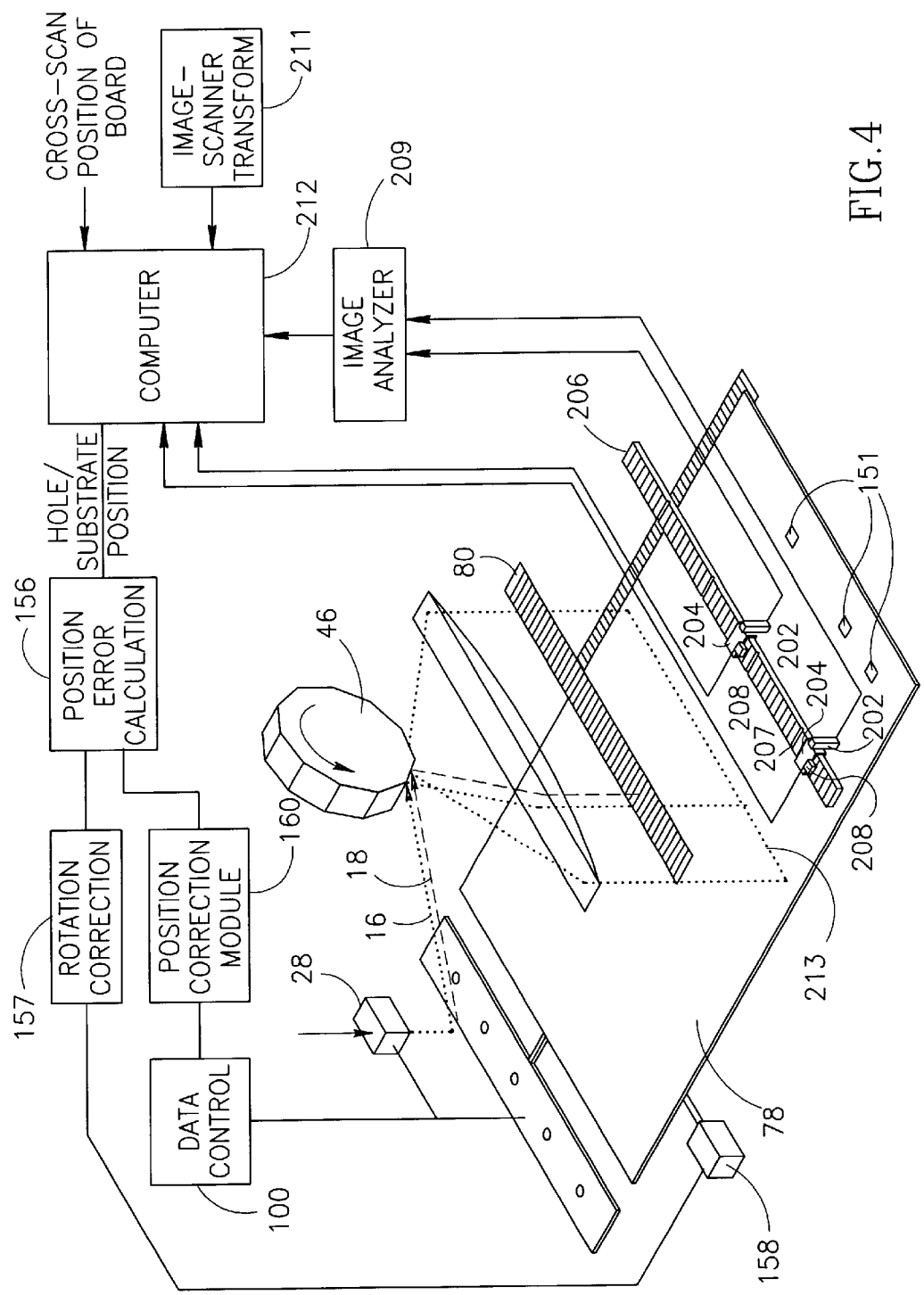
FIG. 4 shows a perspective drawing of a portion of the scanner of FIG. 3, related to the determination of printed circuit board position in accordance with an embodiment of the invention.

FIGS. 3 and 4 show an embodiment 200 of the present invention, which includes apparatus enabling the use of a new method of determining the relative position of the printed circuit board in the scanner useful for aligning images to be written on the respective opposing sides of a printed circuit board.

Figure 1:
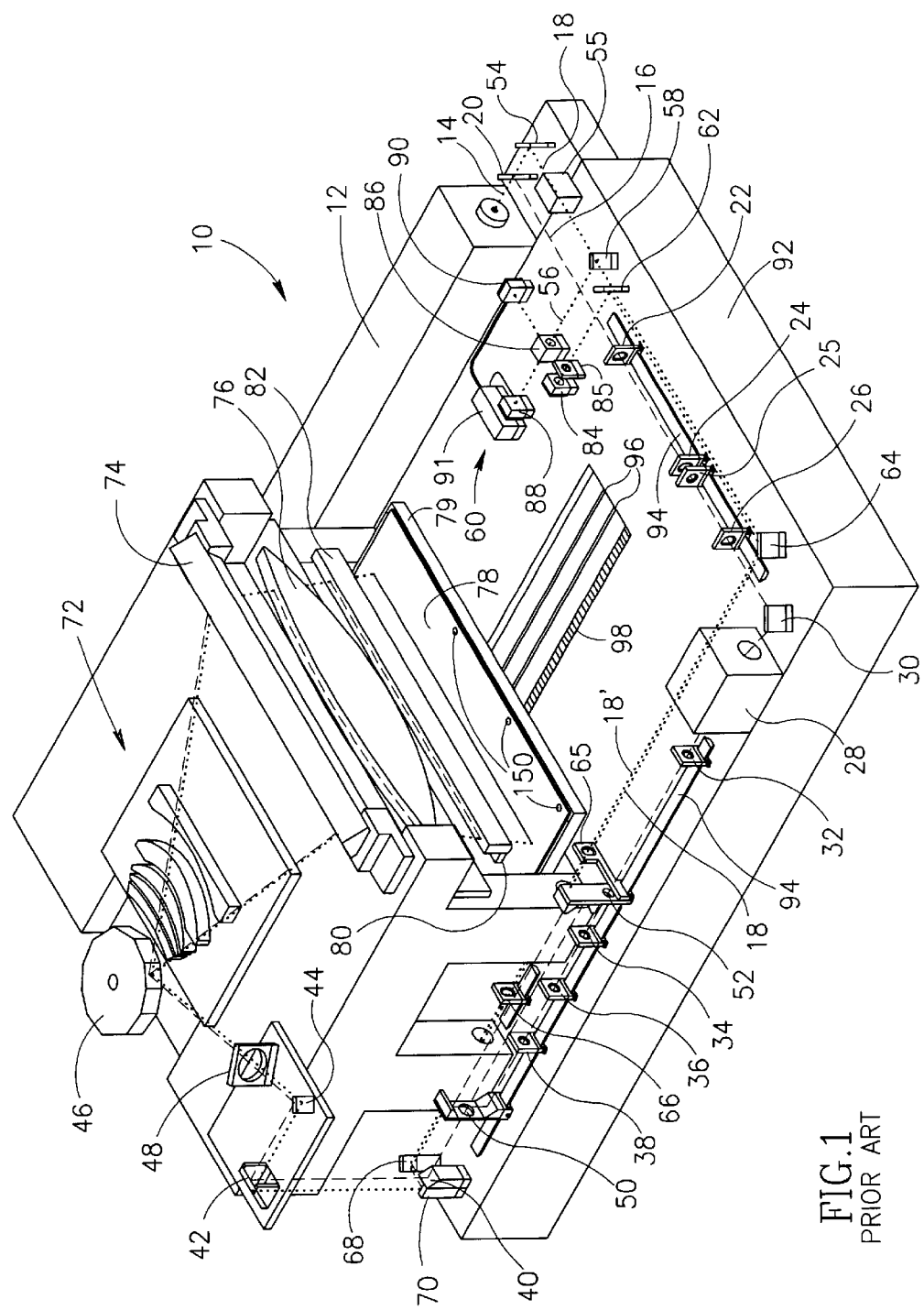
FIG. 1 shows a perspective drawing of a scanner, in accordance with the prior art.
Figure 2:
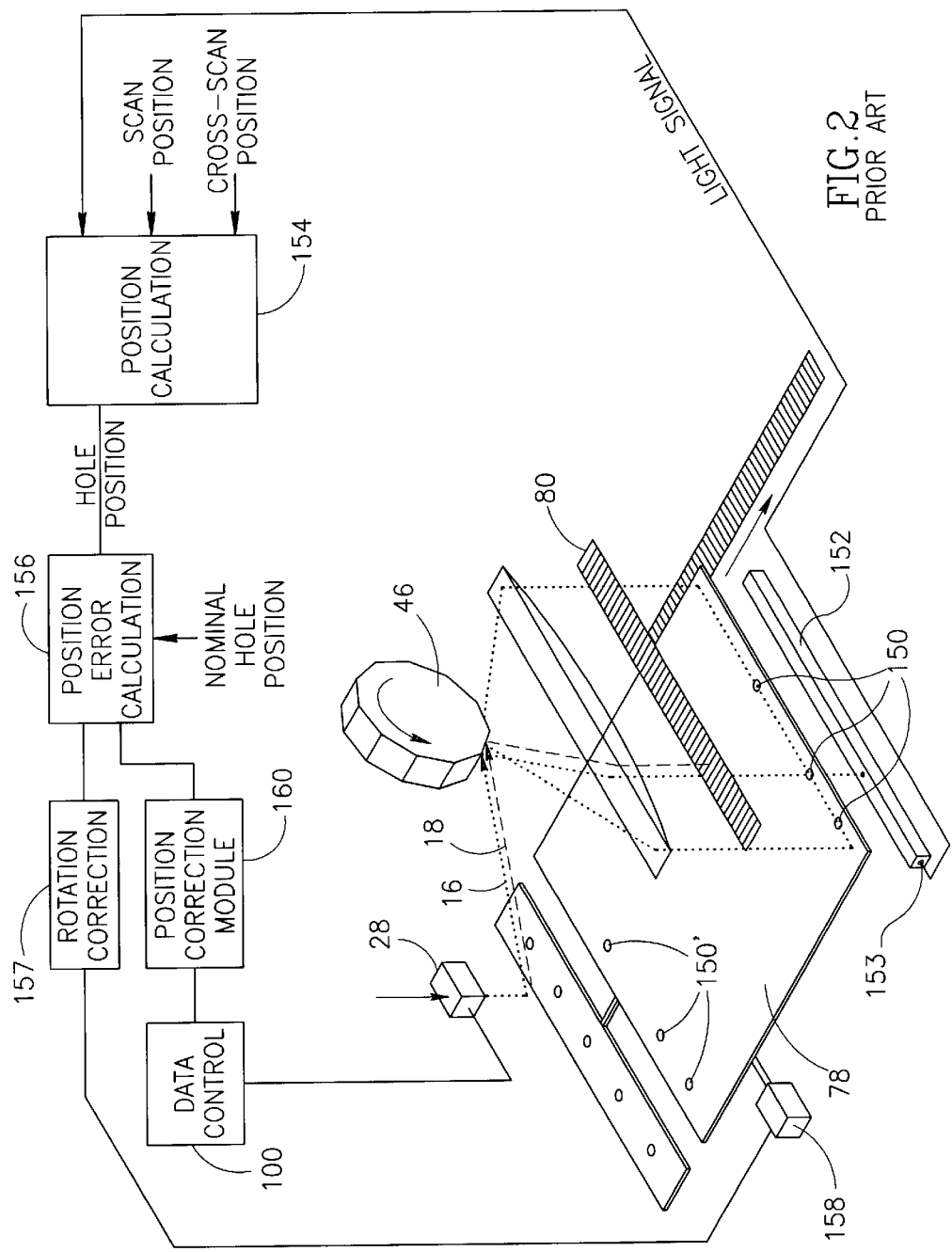
FIG. 2 shows a perspective drawing of a portion of the scanner of FIG. 1, related to the determination of printed circuit board position in accordance with the prior art.

In this system, a principal difference from the prior art system of FIGS. 1 and 2 resides in the mechanism for determining a reference for the scanner for writing an electrical circuit pattern.

Scanner—Imager Coordinate Calibration

It is appreciated that in order to align patterns that are sequentially recorded on a substrate a mechanism is required to coordinate between the respective location of the subsequently recorded patterns. In exemplary embodiments of the invention, an acquired image of a reference pattern is employed. It is desirable to tie together the location of the reference pattern in images to coordinate space of the scanner system to ensure that recorded patterns are properly aligned with respect to the reference pattern.

As shown in FIG. 3, system 200 includes two downward facing imagers 202, such as CCD cameras, mounted on a base 204. In the exemplary embodiment shown, bases 204 are moveably mounted on a rail 206. Movement of the imagers 202 along the rail may be manual or may be motorized using a motor (not shown) attached to the bases 204 or by other means as known in the art. Alternatively or additionally, the rail is formed with detents 207, into which matching elements, such as, for example, spring loaded elements, fit to selectively position the base at any one of a number of fixed positions. Additionally or alternatively, an encoder 208 may be used to determine the position of the base (and thus the imager) along the rail. Encoder 208 may be an optical encoder that determines the position based on a reading of markings 210 on rail 206. Alternatively, encoder 208 may be a mechanical encoder that measures the movement of the base along the rail. Any other type of suitable encoder or other suitable positioning method or method of measuring position, as known in the art, may be used. Alternatively, the imagers are fixed in place. Alternatively, as described below, a single camera may be used. Alternatively, more than two imagers may be used. Alternatively, cameras 202 may be fixed in place and folding mirrors (not shown) may be moveable along rail 206. It is noted that for the various imager configurations, arrangements may need to be provided to enable suitable movement of imagers 202 for adjustment of focusing.

Imagers 202 are positioned such that they view one or more features 151, which may be generated by the scanner or other suitable feature generation device. The image(s) of the feature(s) is (are) analyzed by an image analyzer 209 (which may be a properly programmed computer or other device known in the art) to determine the position of the feature in the coordinate system defined by the field of view of the imagers. These positions are fed to a computational system 212, which may be a general or special purpose computer or other circuitry. The computational system is referred to herein, for simplicity, as "computer 212". Computer 212 also receives an indication of the relative position of the imagers on the rail (when the imagers are not fixed). This indication may be sent to the computer by encoders 208, or, especially where manual movement and detents are used to position the imager, may be inputted manually to the computer.

Computer 212 also generally includes information regarding the relationship between the imager coordinate system and the scanner coordinate system (shown in FIG. 4 as being in an image-scanner transform memory 211), such that the measured position of the features in the imager coordinate system can be translated into the scanner coordinate system. In general, it is desirable (but may not be essential in all cases) to determine a transformation between the coordinate systems.

Figure 7:
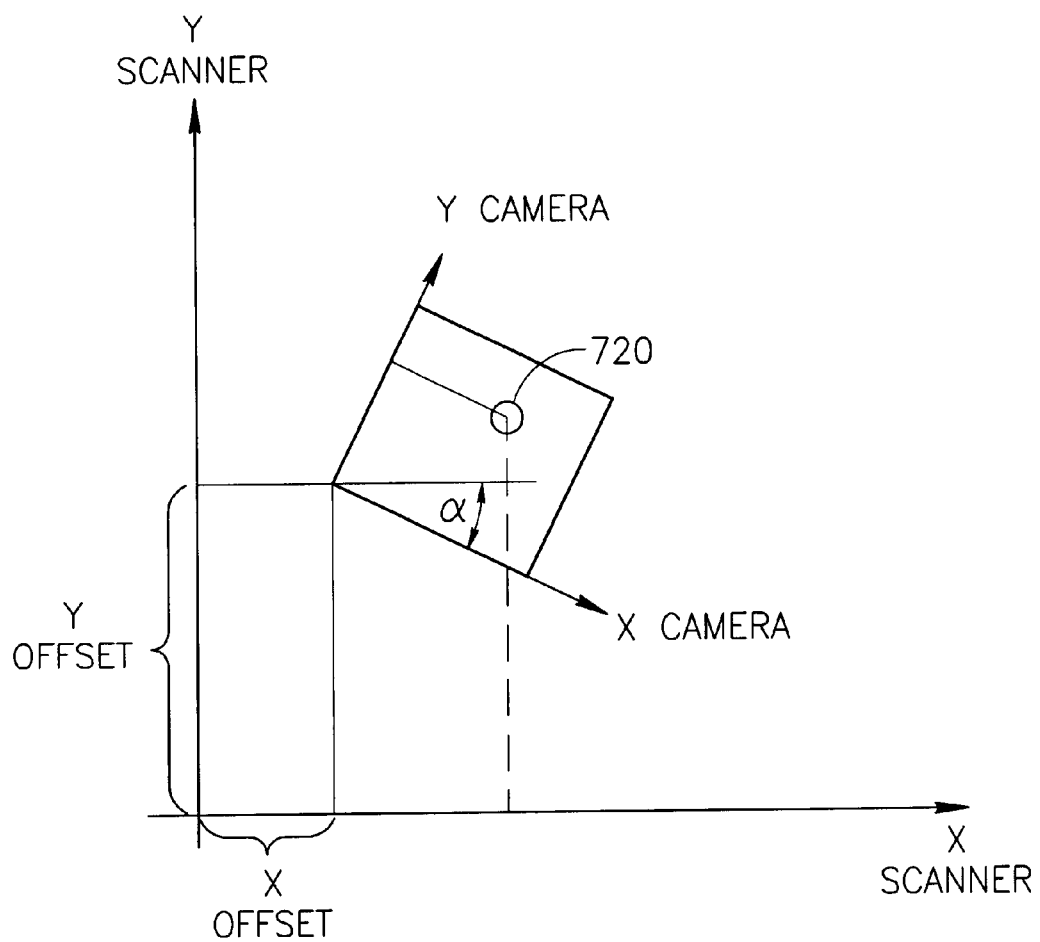
FIG. 7 is a simplified diagram showing calibration transformations between imager coordinate space and scanner coordinate space.

Reference is made to FIG. 7 which is a diagram illustrating calibration transformations that are performed in exemplary embodiments of the invention. Calibration between the imager coordinate system and the scanner coordinate system should account for mutual X, Y translation of a point 720 in imager coordinate space and scanner coordinate space respectively, angular alignment an of imager coordinate space relative to scanner coordinate space, and the size of a pixel in imager coordinate space compared to the size of a pixel written by the scanner.

Figure 5A:
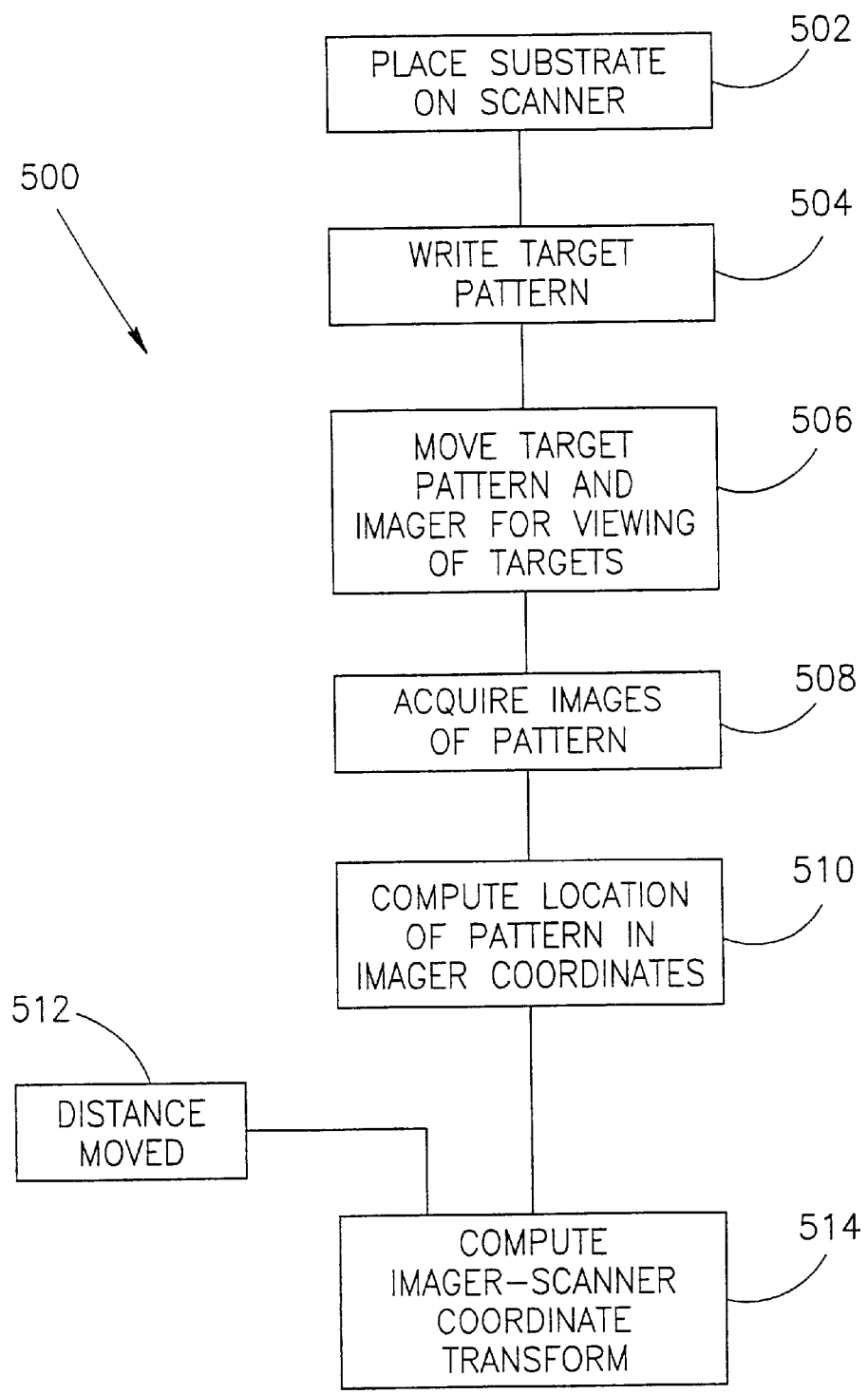
FIG. 5A is a simplified flow diagram of a method of determining an imager-scanner transform in accordance with an embodiment of the invention.

FIG. 5A is a flow diagram of an exemplary method 500 of determining the translation of the coordinate systems in a calibration stage typically performed prior to scanning a batch of printed circuit board substrates.

First (502) a bare photosensitized substrate 78 is placed on the scanner. For the purposes of calibration, no particular orientation of the substrate is necessary, provided that a pattern, or patterns, may be written on the substrate, and that substrate 78 is held in a fixed orientation to a stage 79 (FIG. 3) during the writing and the subsequent imaging by imagers 202.

Next, a "target" pattern 151 of a known size, orientation and position in is written (504) on the sensitized substrate by scanner system 200. In one embodiment of the invention, the sensitized material is of a type that produces a visible "latent" or "printout" image which can be seen even without development or etching when exposed to the (generally, but not always, UV) light used to write the pattern on the sensitized substrate. A suitable substrate for use in the calibration process which forms a visible "latent" image when exposed to UV light of a scanner system is Dulux Registration Master photosensitive sheets available from DuPont.

In exemplary embodiments of the invention, the target pattern or patterns for calibration are written onto the photosensitive substrate such that they can be viewed from one or more positions at which the imager can be placed, and in particular, at positions at or near where the imagers are placed to view alignment patterns written on the substrate during scanning. The pattern is written on a portion of the substrate that is located under the scanning line 213 shown in FIG. 4. Optionally an array of alignment patterns is written and the patterns in the array are viewed sequentially.

A plurality of alignment patterns 151 is optionally written at various imager positions such that these patterns can be imaged by one or more imagers 202.

Then the scanner 200 moves the substrate (506) such that the patterns are in a position for viewing by the imager(s). The imagers are placed in position (when they have to be used) so that they sequentially view each of the patterns 151, and the location of each pattern 151 is stored in image-scanner transform memory 211. As is well known and shown in FIGS. 1 and 2, scanners are provided with very accurate means for measuring the movement of the substrate in the cross-scan direction, as well as for determining the precise location at which a beam 16 records data in the scan direction.

The imagers acquire images of the patterns (508) and pass them to analyzer 209, which may be, in a practical situation hardware and software associated with computer 212.

Analyzer 209 computes a reference location of each pattern, for example a center point, a corner point, or some other reference point in the pattern, with respect to the particular imager coordinates and passes the information to computer 212.

Computer 212 calculates (510) the position, orientation and scaling of the patterns in the imager coordinate system. This calculation may be determined, for example, by determining the position of the pattern in the imager coordinate system and then transforming this position by the measured movement of the substrate. Suitable methods for determining the location of the pattern in the imager coordinate system include blob analysis and pattern matching. It may be helpful to calibrate the imagers against each other by having them view the same pattern, without moving the pattern. To do this, the imagers are sequentially positioned to view the pattern (for example using the same detent for more than one imager). The positions (and optionally the orientations) of the images is used to determine a transformation which corrects for the differing placements of the imagers on their respective bases.

Computer 212 also receives information as to the distance moved by the substrate during the movement (512), as described above.

Computer 212 computes a transform (514) between the coordinate systems of each imager and of the scanner respectively. This transform is based on the known positions at which a calibration pattern was written in the scanner coordinate system, the distance the board traveled and the position of the pattern in the imager coordinate system. This transformation may be stored in memory locations in computer 212, which may be a general purpose computer or a special purpose computer.

This transform (including information relating the coordinate systems of the various imagers in the various positions to the overall imager coordinate system) is stored, for example in image scanner transform memory 211, for use by the computer.

The patterns 151 may be a simple cross-hair pattern or they may be a more complex pattern. Alternatively, the pattern may comprise a series of crosses or dots.

Figure 6A:
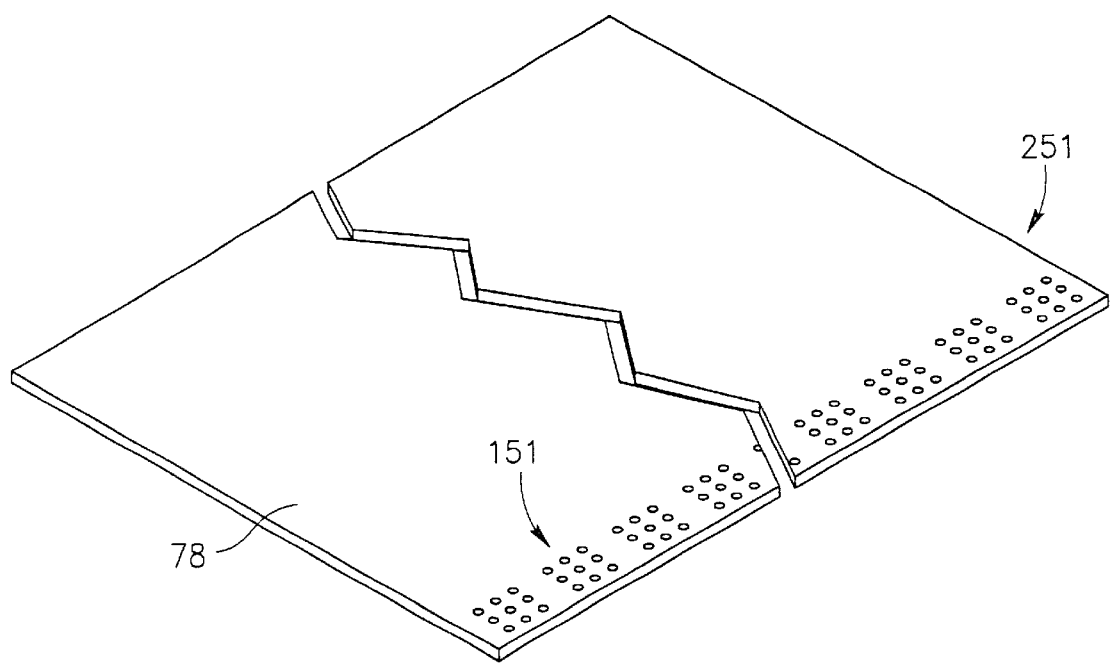
FIG. 6A shows a perspective drawing of an array of calibration and/or alignment patterns written on a substrate.

Reference is now made to FIG. 6A which illustrates an array 251 of exemplary patterns 151 employed to calibrate X, Y translation between the imager coordinate space and scanner coordinate space. As seen in FIG. 6A, array 251 comprises a plurality two dimensional patterns 151 generally extending the length of an edge of substrate 78, wherein each pattern 151 is formed of a 3×3 matrix of equidistant dots. As seen in the exemplary pattern appearing in FIG. 6A a suitable pattern comprises a 2-dimensional 3×3 array of 0.08" diameter dots mutually spaced apart by 0.1". Other suitable arrays of patterns, including suitably sized dots and distances between dots may be used.

These patterns, when written by a scanner system, allow for the determination of X and Y translation distances, precise determination of a center point of the pattern for calibration of a transform, and an angular orientation of an imager in space relative to the scanner so as to enable compensation for angular offset, distortion, and differences in magnification between extremities of an image acquired by the imager, and coordination of camera pixel size to scanner pixel size.

It is noted that when an array 252 of patterns 151 is used, the position for each pattern is determined and its respective translation is stored in a data base thus correlating position translation of imager for a series of locations. Moreover, the calculation may be based on movement of the substrate, location of an imager 202 with respect to each pattern 151 in array 251 and the location of the reference point in each of images 151 in the field of view of an imager 202.

The calibration described with respect to FIG. 5A may be repeated as desired to assure that there is no change in the transformation. It could even be performed on each PCB, although this is seldom necessary. However, since the method requires writing of a particular calibration pattern each time, it is also possible to perform a simplified check on the transformation, as described with reference to FIG. 5B, which shows a method 530 which may result in a correction to the basic alignment achieved by the method of FIG. 5A. In accordance with some embodiments of the invention a jig 161, comprising a through hole 163, attached to base 79 is provided to facilitate coordinate space alignment between the coordinate systems of imagers 202 and scanner system 200.

Figure 5B:
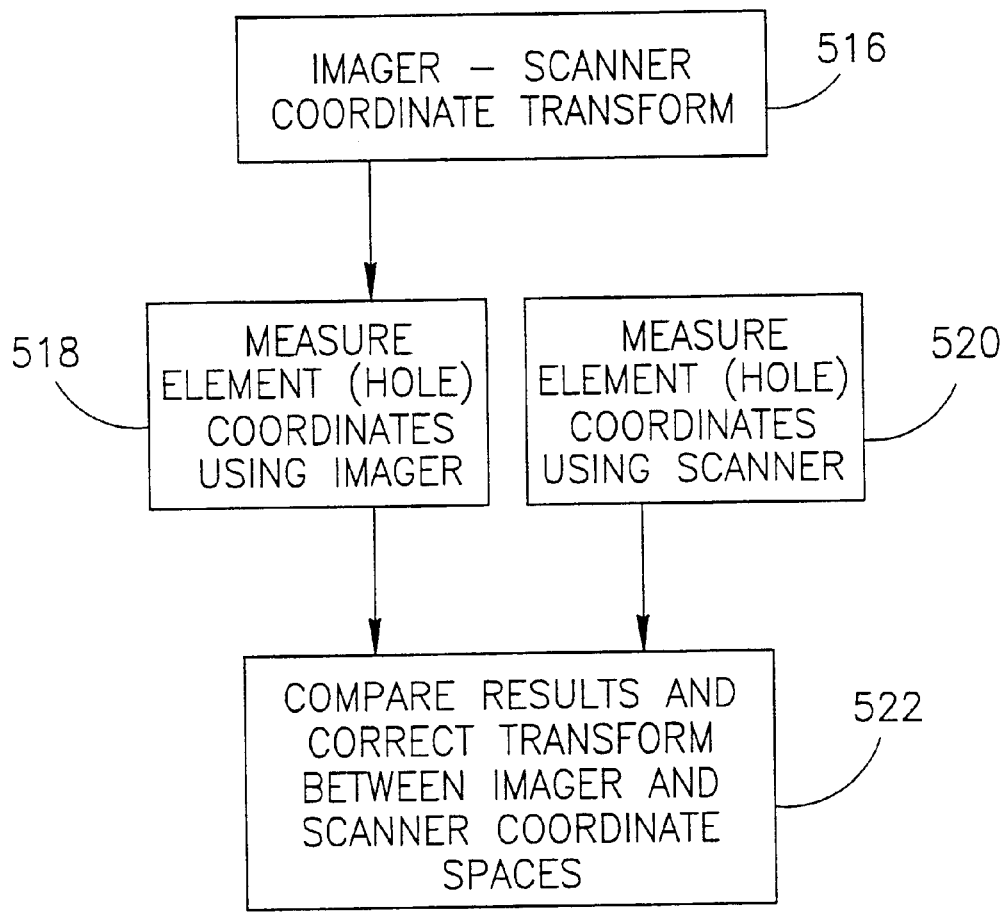
FIG. 5B is a simplified flow diagram of a method of calculating offset corrections between imagers and scanner prior to imaging a circuit pattern.

As seen in the flow chart of FIG. 5B, image scanner coordinate transform data, for example, as derived using the method of FIG. 5A, is received (516). The location of hole 163 is determined using an imager (518) and transformed to scanner coordinates using the transform. The location of hole 163 is also determined in the coordinate system of scanner 200 using beam 16 (520). A suitable method for determining the location of hole 163 using beam 163 is described in PCT patent publication WO 00/02424 and with respect to FIG. 2 above. Beam 16 is scanned over hole 163, and a collector 152 is provided underneath base 79 to collect light inputs as beam scans the hole. On-off modulation, as the beam passes the hole, of the signal from the light collector enables precise determination of the location of edges of hole 163, and precise determination of the location of the center of hole 163 therefrom. The location of hole 163 as determined by an imager 202 and corrected by the imager scanner coordinate transform, and the hole location determined using beam 16 are compared (522) and aligned to ensure precise correlation between imager coordinate space and scanner coordinate space for each scan. The alignment factor is stored in computer 212.

Figure 5C:
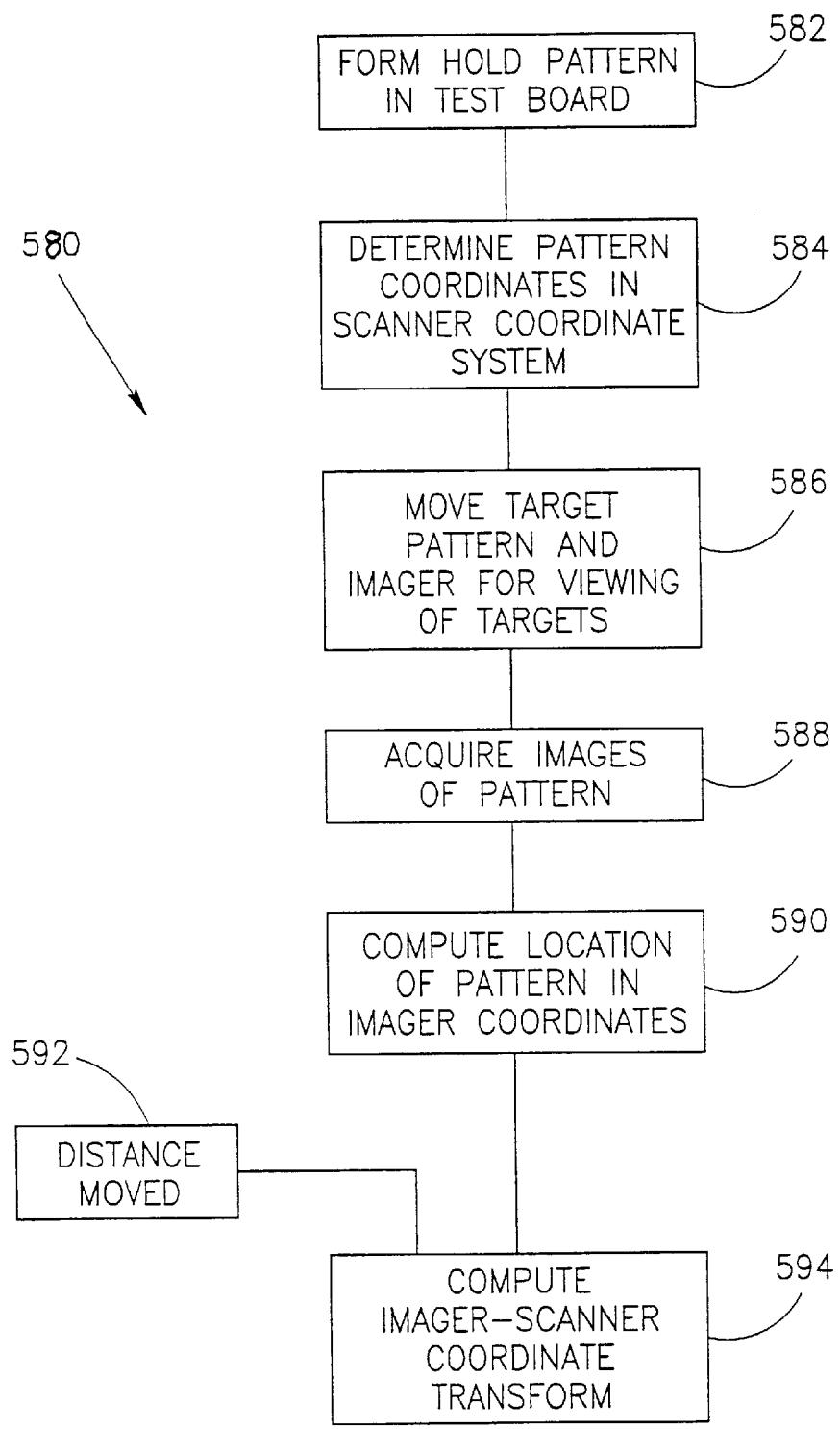
FIG. 5C is a simplified flow diagram of an alternative method of determining an imager-scanner transform in accordance with an embodiment of the invention.

FIG. 5C shows another method (580) for determining a transform between the imager and scanner coordinate systems respectively. In this method a series of patterns of holes, such as holes in the pattern shown in FIG. 6A is formed in a calibration board (582). Alternatively, simpler patterns may be formed.

The coordinates of the pattern are determined in scanner space using the method described in PCT patent publication WO 00/02424 and with respect to FIGS. 2 and 5B above (584). The board is then moved (586), together with the table, the accurate table-motion measuring system built in to the scanner.

The imagers acquire images of the patterns (588) and pass them to analyzer 209, which may be, in a practical situation hardware and software associated with computer 212.

Analyzer 209 computes (590) a reference location of each pattern, for example a center point, a corner point, or some other reference point in the pattern, with respect to the particular imager coordinates and passes the information to computer 212.

Computer 212 calculates (590) the position, orientation and scaling of the patterns in the imager coordinate system. This calculation may be determined, for example, by determining the position of the pattern in the imager system and then transforming this position by the measured movement of the substrate. It may be helpful to calibrate the imagers against each other by having them view the same pattern, without moving the pattern. To do this, the imagers are sequentially positioned to view the pattern (for example using the same detent for more than one imager). The positions (and optionally the orientations) of the images is used to determine a transformation which corrects for the differing placements of the imagers on their respective bases.

While this system does allow for the determination of an accurate transform, it requires the production of a special printed circuit board jig and the provision of a table with holes and a detector such as detector 152, 153 shown in FIG. 2.

Computer 212 also receives information as to the distance moved by the substrate during the movement (892), as described above.

Computer 212 computes a transform (894) between the coordinate systems of each imager and of the scanner respectively. This transform is based on the known positions at which a calibration pattern was written in the scanner coordinate system, the distance the board traveled and the position of the pattern in the imager coordinate system. This transformation may be stored in memory locations in computer 212, which may be a general purpose computer or a special purpose computer.

This transform (including information relating the coordinate systems of the various imagers in the various positions to the overall imager coordinate system) is stored, for example in image scanner transform memory 211, for use by the computer.

In some embodiments of the invention greater accuracy in determining the transform and greater accuracy in determining the position of alignment patterns can be achieved by calibrating the field of view of the imager itself. A method 600 of performing such calibration is shown schematically in the flow chart of FIG. 8. In some embodiments of the invention, calibration of the field of view of the imager is performed as a single step along with determination of the translation of the coordinate systems.

A calibration pattern is provided (602) for viewing by the imager. In an embodiment of the invention, an accurate pattern, for example an array of precisely sized and positioned dots appearing as a pattern 151 in FIG. 6A, is scanned onto or formed in a substrate by scanner system 200. In some exemplary embodiments, it is sufficient to use a single pattern 151 for the purpose of field of calibration, although improved results may be obtained by using multiple patterns 151.

The patterns and imagers are moved to enable viewing of the patterns by respective imagers and images of the calibration patterns is acquired (604). The locations of the pattern elements forming patterns 151 in the coordinate system of the imager are determined (606) by image analyzer 209 or by computer 212 and compared (608) to the actual relative positions of the elements on the pattern, determined, for example from knowledge of the location where they are recorded by scanner system 200.

Due to variations in the magnification of the image pattern as seen by the imager, distortion, angular orientation of the imager in space not in alignment with respect to the scanner, and aberrations in the imager optics, the position and size of the elements on the image (in the coordinates of the particular imager) may not precisely correspond to those of the actual pattern. Analysis of the image enables physical adjustment of the imager to partially align the imager relative to the scanner. Additionally, computer 212 computes a calibration transformation (610) to transform imager coordinate position with the actual position in the field of view of the imager to calibrate pixel size of pixels in the imager to the pixel size of pixels written by the scanner and to correct for any remaining, magnification errors, distortions or other image aberrations.

It should be understood that the actual position of the pattern is not critical since it is the relative positions, spacings and/or size of the elements of pattern in the field of view of the imager that is used to calibrate the field of view of an imager. This transformation is used in all measurements made with the imager, as for example, the measurements of position of a pattern as in the method of FIG. 5 or in the position of an alignment pattern in a substrate. The corrections for pixel size may be a single value as a function globally correcting for all pixels, or a function taking into account magnification errors, distortions and aberrations that are not uniform over the entire field of view of an imager 202.

Figure 8:
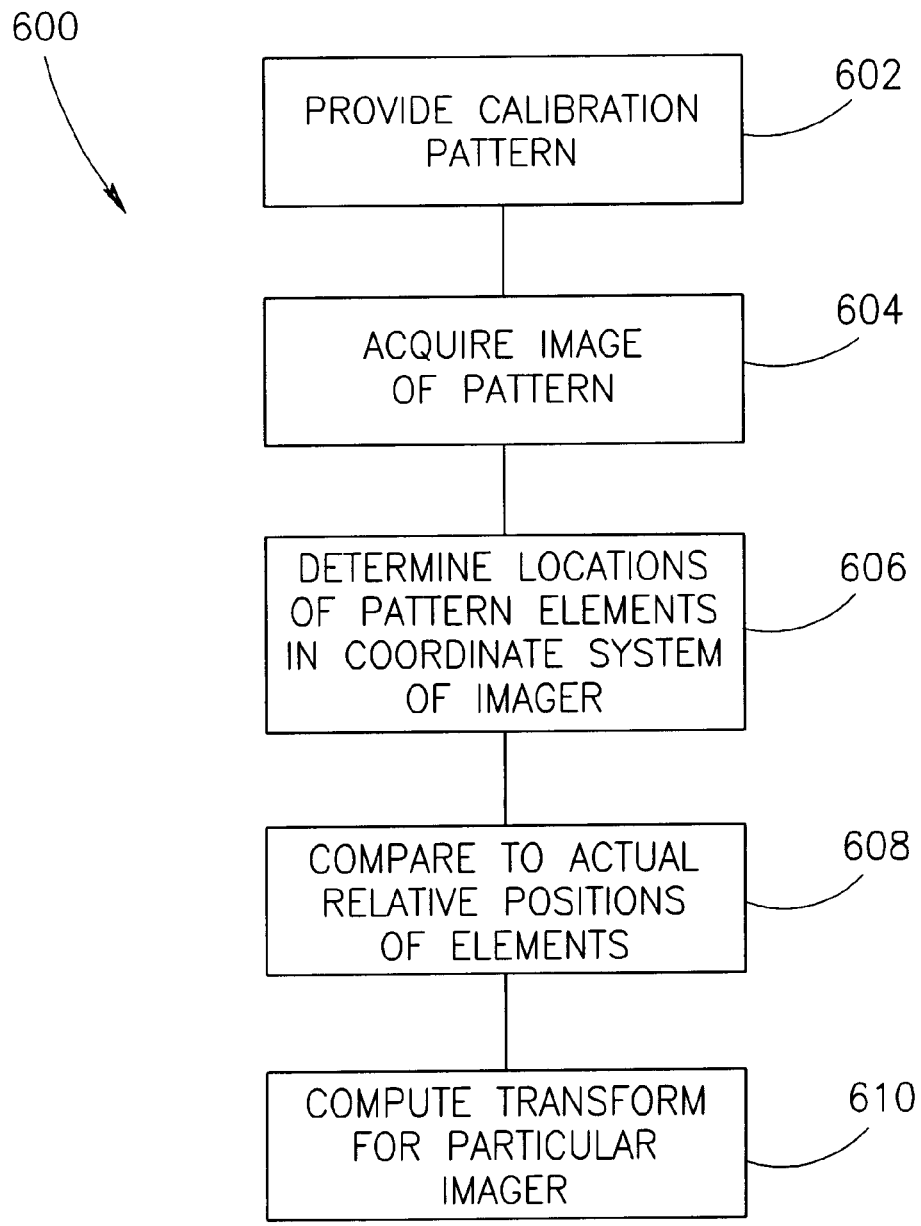
FIG. 8 is a simplified flow diagram of a method of computing position corrections for an imager, in accordance with an embodiment of the invention

It should be understood that the methods of FIGS. 5 and 8 can be performed in essentially a single operation by writing a pattern on a sensitized substrate that can be used for both determining a coordinate transformation between the imager and scanner systems and an internal calibration of the field of view of the imagers. For example, if a pattern comprising an array of equally spaced elements (such as dots or cross-hairs having different extent from the central one) is written on the board, a center point of the array can be calculated and used to determine the coordinate transform between the imager system and the scanner system. Alternatively, a cross hairs indicating a particular reference point along with additional elements may be provided. Either way, the plurality of elements can be used to calibrate the field of view of the imager itself and calibrate the coordinate space of the field of view of the imager to correspond to the coordinate spaced of the scanner.

The transform may be stored in image analyzer 209 and may be used to correct images received from imagers 202 before any processing is performed on or using them.

Side to Side Alignment

Figure 9:
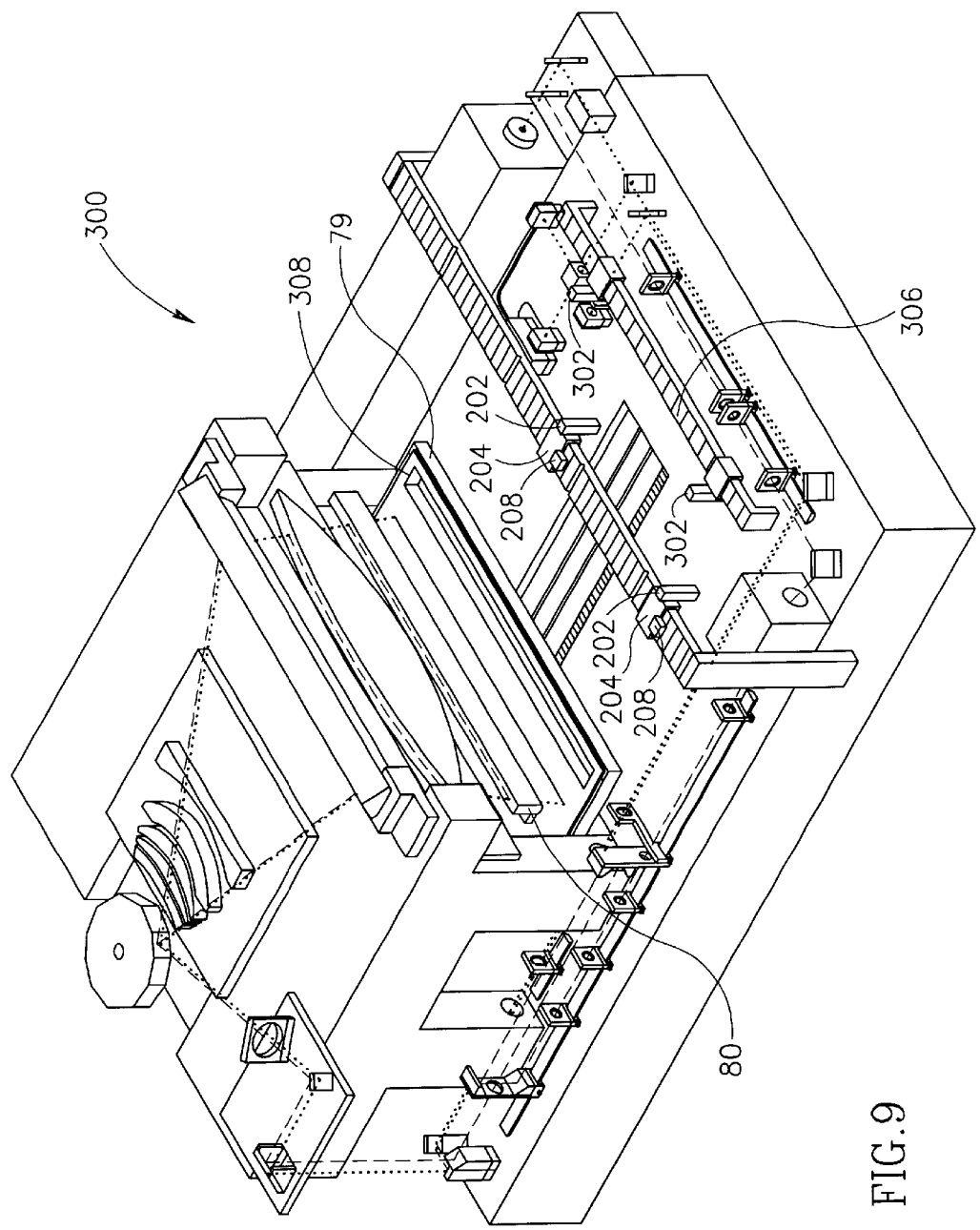
FIG. 9 shows a perspective drawings of a portion of apparatus useful for aligning images on two sides of a PC board, in accordance with an exemplary embodiment of the invention.

FIG. 9 shows a first apparatus 300, in accordance with an embodiment of the invention, by which patterns to be recorded on the first and second sides of a printed circuit board substrate can be mutually referenced or aligned, without utilizing holes or edges. The apparatus depicted in FIG. 9 is generally similar to that shown in FIG. 1, except for the features noted below. Most of the reference numbers in FIG. 1 have been omitted from FIG. 9, for clarity.

As shown in FIG. 9, one or more cameras 302 (similar to the cameras 202) mounted on a rail 306 (similar to rail 206) view the bottom of board 78. The coordinate system of cameras 302 is referenced to the coordinate system of system 300, for example, using the method described below. Table 79 typically is formed with a slot 308 through which cameras 302 can view the bottom of board 78.

Figure 6B:
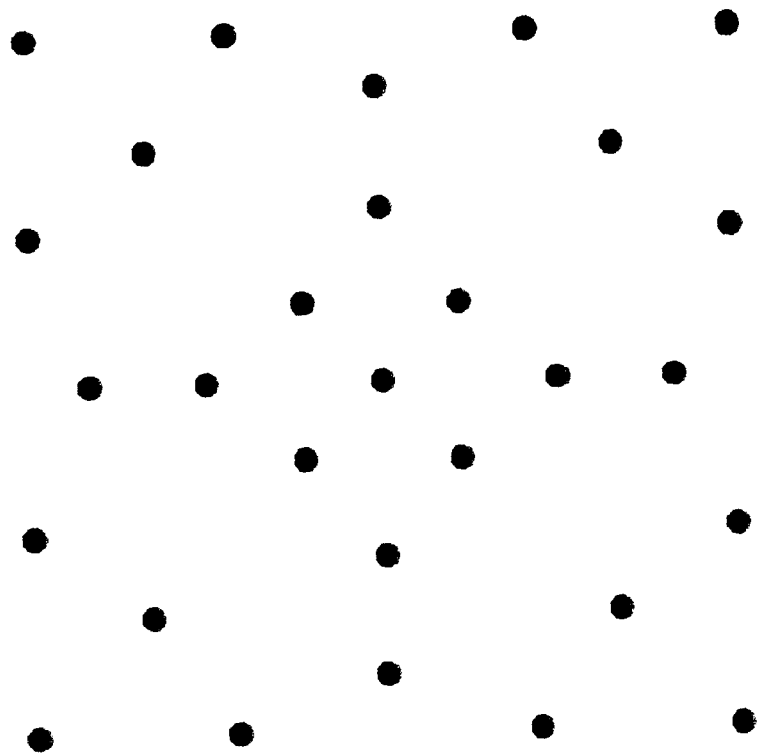
FIG. 6B is an illustration of an alignment pattern in accordance with an embodiment of the invention.

An electrical circuit pattern along with one or more suitably located alignment patterns (FIG. 6A or 6B) are written on a first side of a printed circuit board substrate. After the patterns are written, the board is turned over. The slot 308 is located in a position so that when board 78 is inverted alignment patterns 151 may be viewed by cameras 302 through slot 308. It is appreciated that the pattern shown in FIG. 6B is formed of structures spaced apart in a generally non-periodic arrangement. Such an arrangement may be easier to align than periodic patterns.

Thus, when the board 78 is inverted, cameras 302 view the alignment patterns formed on the side of the PC board on which an electrical circuit pattern has been recorded by an electrical circuit image pattern writing system, such as system 300, and provide information regarding the position of these patterns, in the coordinate system of imagers 302 to computer 212 (FIG. 4). Computer 212 computes the position of the alignment patterns in the scanner coordinates, and provides an output to the data control 100 (typically but not necessarily via a position error calculator and position correction module) to enable the alignment of images written by the scanner on both sides of the PC board.

In order to determine a transformation between the positions of images in the coordinate system of imagers 302 as viewed by imagers 302 with respect to the coordinate system of scanner system 300, the coordinate system of imagers 302 is aligned to the coordinate system of scanner system 300. A test PC board with through holes (such as holes 150 in FIGS. 1 and 2, as used in the prior art for alignment) is placed in system 300 and viewed by both imagers 302 and 202 without moving the test board. Since the holes are in the same place on table 79 when viewed both by imagers 202 and 302, and a transformation between imagers 202 and scanner system 200 already has been computed, a transformation between imagers 302 and scanner system 300 is easily derived.

Figure 10:
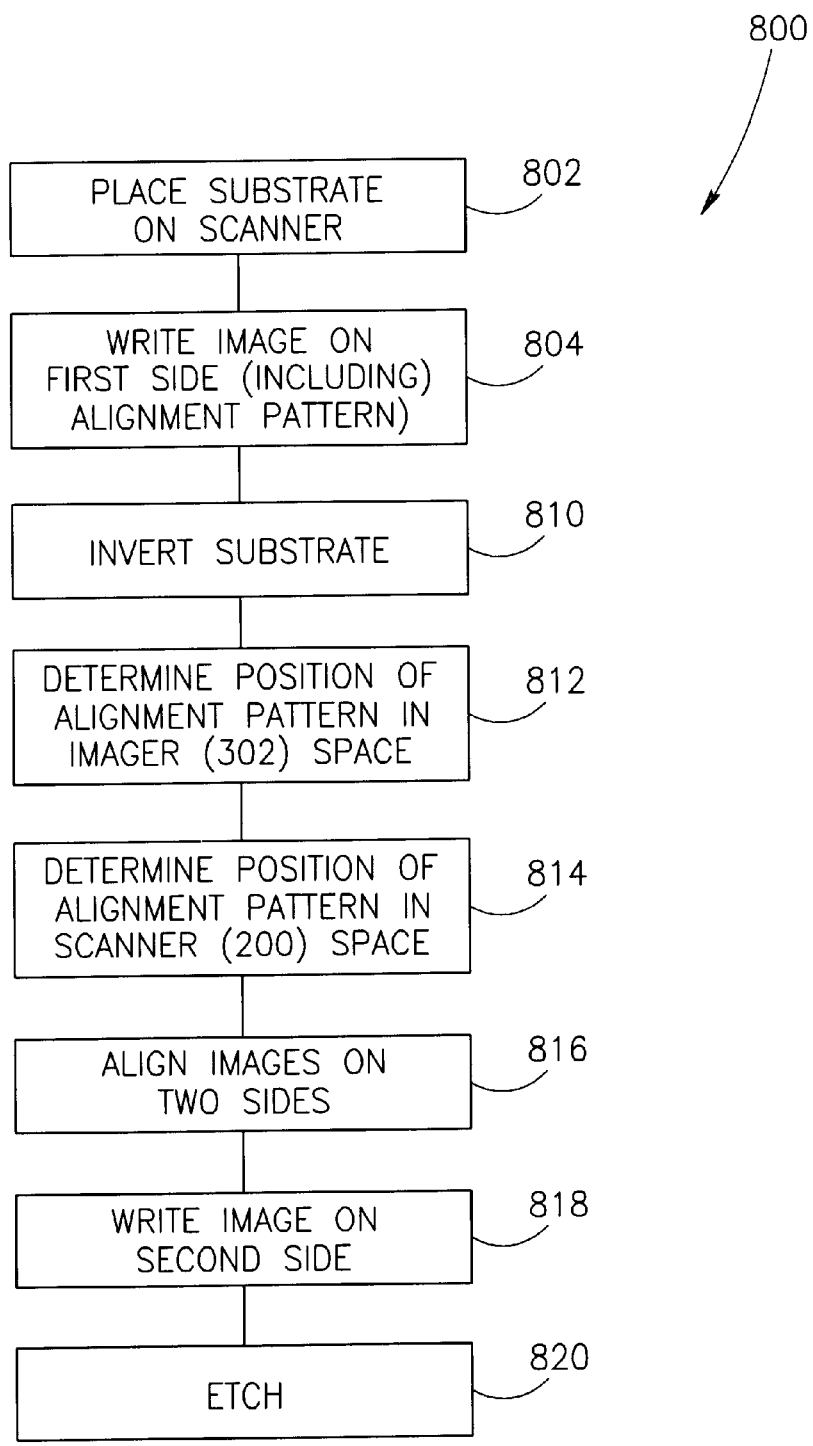
FIG. 10 is a simplified block diagram of a method of direct scanning of two sides of a printed circuit board, for example using the apparatus of FIG. 9.

FIG. 10 is a block diagram of an exemplary method 800 of printing aligned images on two sides of a printed circuit board using the apparatus of FIG. 9.

A printed circuit board substrate is placed on the scanner (802). The board is preferably roughly aligned by placing pins on the base into alignment holes (not shown). An image of an electrical circuit pattern, including one or more alignment patterns, is written on substrate board 78 (804) by an electrical circuit image pattern writer, such as scanner system 300. It is appreciated that the alignment patterns have a predetermined alignment with reference to the electric circuit pattern recorded by scanner 300 on board 78. The substrate board 78 is inverted such that the other side of substrate board 78 is available for imaging and scanning (810).

The alignment pattern is imaged by imagers 302 and the position of the alignment pattern in the coordinate system of imagers 302 is determined (812). This position is transformed into the coordinate system of scanner 300 (814), using a transform calculated as described hereinabove, to allow alignment of the image of an electrical circuit pattern to be formed on the second side by the scanner 300 to be aligned to the alignment pattern viewed by imagers 302, and hence the rest of the image of an electrical circuit pattern already formed on the first side (816) of board 78. Alignment generally requires an x-y movement of the data, and optionally angular rotation of board 78, typically performed by mechanical rotation of table 79. Such alignment is shown as elements 156, 157, 158, 160 and 100 on FIG. 4.

A pattern is written on the second side of the board by the scanner (818) and both sides are developed and etched (820) to form etched patterns on both sides of board 78.

It is appreciated that the method of FIG. 10 requires that a second set of cameras be provided to view the second side of board 78. This is sometimes cumbersome and may add extra expense to the system. FIGS. 11A–11D show alignment pattern formation systems, operative in an electrical pattern image exposure system such as scanner system 200 (FIG. 3), to carry out alternative exemplary methods of recording an alignment pattern directly onto the reverse of a board. The systems shown in FIGS. 11A–11D are useful for aligning images on both sides of the PC board without holes and without the provision of cameras to view the second side of board 78.

Figure 11A:
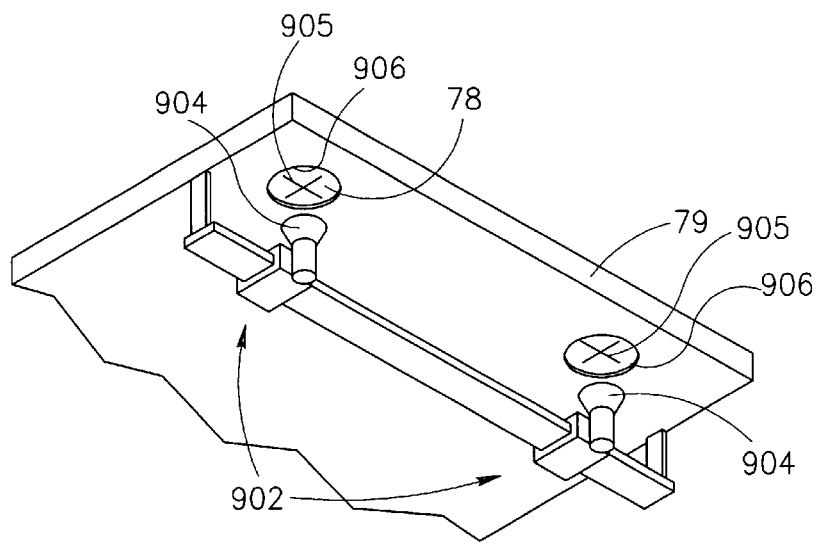
FIGS. 11A–11D are perspective drawings of a portion of alternative apparatus useful for aligning images on two sides of a PC board, in accordance with exemplary embodiments of the invention.

FIG. 11A shows a plurality of alignment pattern generators 902 provided along the bottom of table 79 of an electrical circuit image pattern recorder, such as a laser direct imaging system similar to system 200 seen in FIG. 3. These pattern generators 902 may be any suitable pattern generators configured and operative to mark a physical pattern on the underside of board 78 before, during or after a pattern is scanned onto the top surface of board 78 by scanner system 200. The markings may be formed at predetermined locations on the second, or underside, of board 78. The marking is left in place to provide a registration and alignment pattern when board 78 is inverted for subsequent scanning a pattern on the second side.

In accordance with a first exemplary embodiment of the invention, pattern generators 902 form a physical marking, for example by dimpling or by printing a visible ink pattern, onto the underside of board 78 through a hole 906 in table 79.

In accordance with another exemplary embodiment of the invention, pattern generators 902 are formed of light sources 904 which image a reticule 905, such as through an opening 906 in table 79 to form an exposure pattern on a photosensitive coating (not shown) on the underside of PC board 78.

In exemplary embodiments of the invention, light sources 904 are configured to expose a "latent" or "printout" image pattern that is visible without developing. The image is formed substantially during the entire time that a pattern is scanned on the top side of board 78. Thus when a long exposure time is used, for example substantially the entire length of time required to scan an electrical circuit pattern onto the top side of board 78, typically between 10–60 seconds, it is sufficient to employ a relatively low power light source. An exemplary light source 904 is formed from light emitting diodes emitting light in a suitable spectrum to expose a suitably photosensitized region on the underside of board 78. A suitable diode light source 904 is a 0.75–1.0 mW optical power UV (375 nm peak wavelength) light emitting diode such as the model NSHU550 UV LED available from Nichia Corporation of Japan.

Suitable photosensitization may be provided, for example, by use of photoresist which is formulated to provide a "latent" or "printout" image that is visible without developing the photoresist, when exposed to UV light. A suitable photoresist is the Riston LaserDirect LDI100 photoresist available from DuPont. Alternatively, a photosensitive label (not shown) may be applied to the underside of board 78 at suitable locations to enable the formation of a visible "latent" or "printout" image when exposed to light from pattern generator 904. Such a label may be formed, for example, from Dulux Registration Master photosensitive sheets available from DuPont. The label is left in place on board 78 once board 78 is inverted to scan a pattern onto the underside thereof.

Figure 11B:
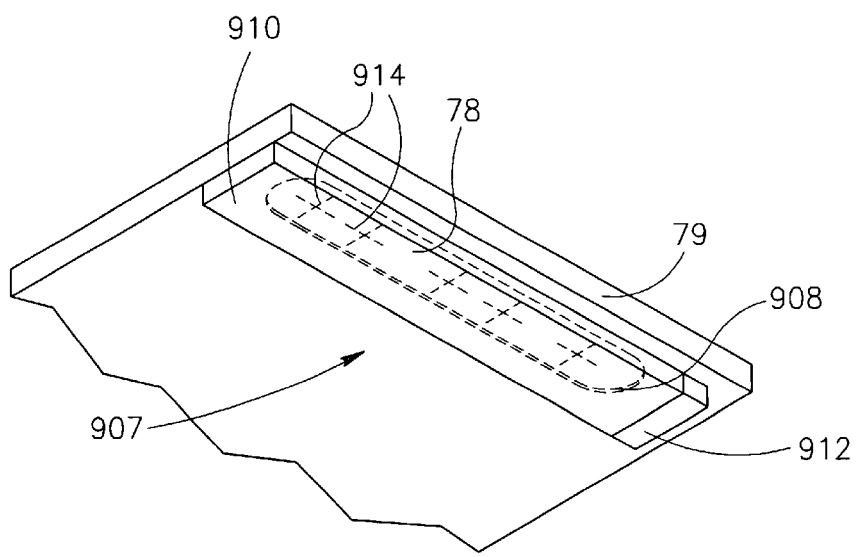

FIG. 11B shows another exemplary embodiment for forming a pattern on the reverse side of a board 78. In FIG. 11B the a pattern generator 907 for forming alignment patterns on the reverse side of a board 78 is a leaky waveguide 910, fed by a light source 912, such as a low power LED as described hereinabove. Table 79 is provided with a slit opening 908. A reticule, or other suitable pattern mask 914, is placed between the waveguide and the bottom of board 78. Use of the apparatus of FIG. 11B allows for varying the position, type and extent of the alignment pattern, to suit, for example, the side of a PC board, or to accommodate an electrical circuit pattern to be written thereon.

Figure 11C:
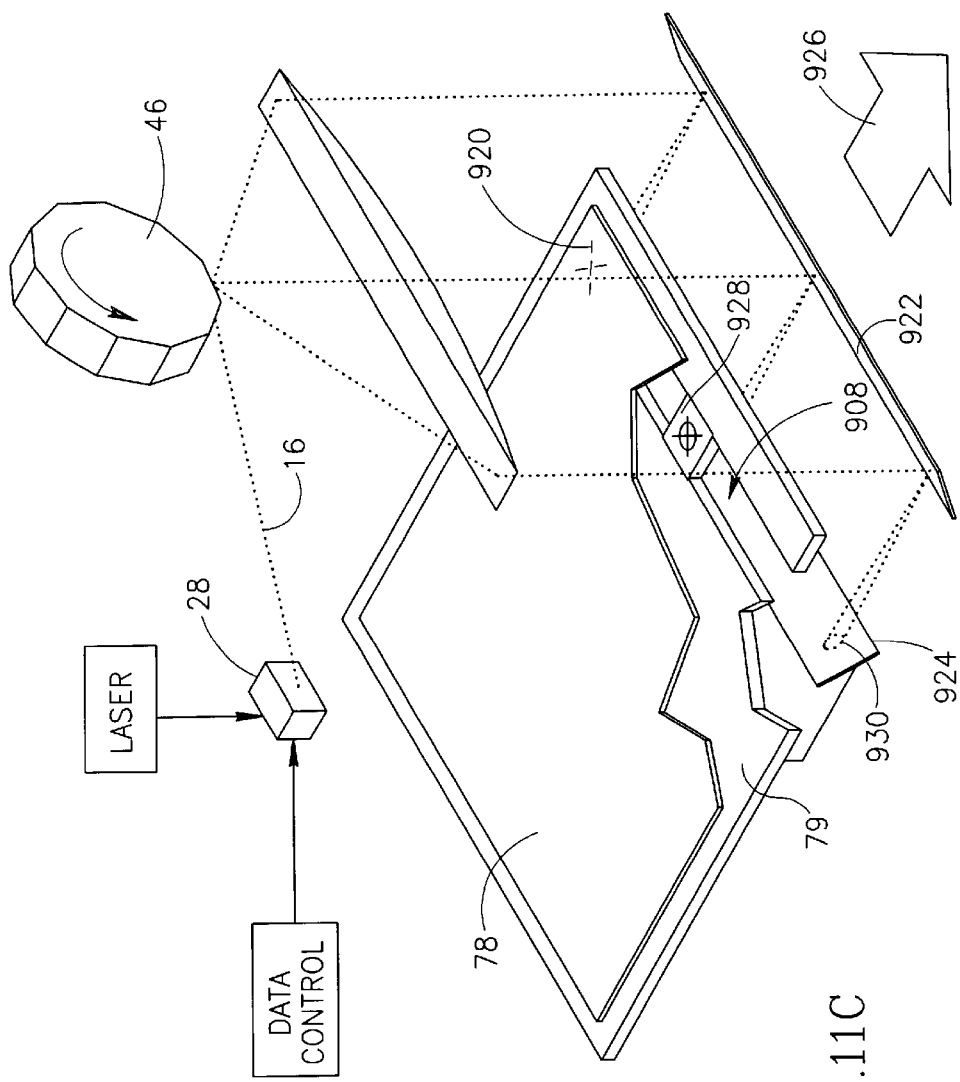

FIG. 11C shows still another exemplary embodiment of the invention for forming alignment pattern 920 on the underside of board 78. Board 78 and table 79 are each shown partially cut away so that part of a unit for exposing an alignment pattern on the underside of board 78 can be seen. As seen in FIG. 11C, table 79 is provided with a slit-like opening 908. Board 78 at least partially overlays opening 908. Any other suitable opening, such as a round or square hole is also suitable.

A first mirror 922 is mounted to a front edge of table 79, and a second mirror 924 is mounted to table 79 below slit 908. Board 78 is suitably photosensitized at underside portions thereof which overlay slit 908. As table 79 progresses in the direction of arrow 926, a beam 16 used for scanning an electrical circuit pattern onto a top surface of board 78, travels along an optical path via a data modulator 28 and a polygon 46, and is routed first via mirrors 922 and 924 to expose the photosensitized portion of the underside of board 78. While exposing the underside of board 78, beam 16 may be modulated or not modulated to form a pattern. Typically however beam 16 is not modulated and passes through a reticule, or other suitable pattern mask 928, because the increase in optical path length necessary to expose the underside of board 78, as compared to the top side of board 78, results in a defocusing of beam 16. Exposure of the photosensitized portion on the underside of board 78 forms a "latent" or "printout" image, which is visible without developing, resulting in alignment pattern 920. As table progresses further, beam 16 moves off of mirror 920 and scans top surface of board 78 directly.

Figure 11D:
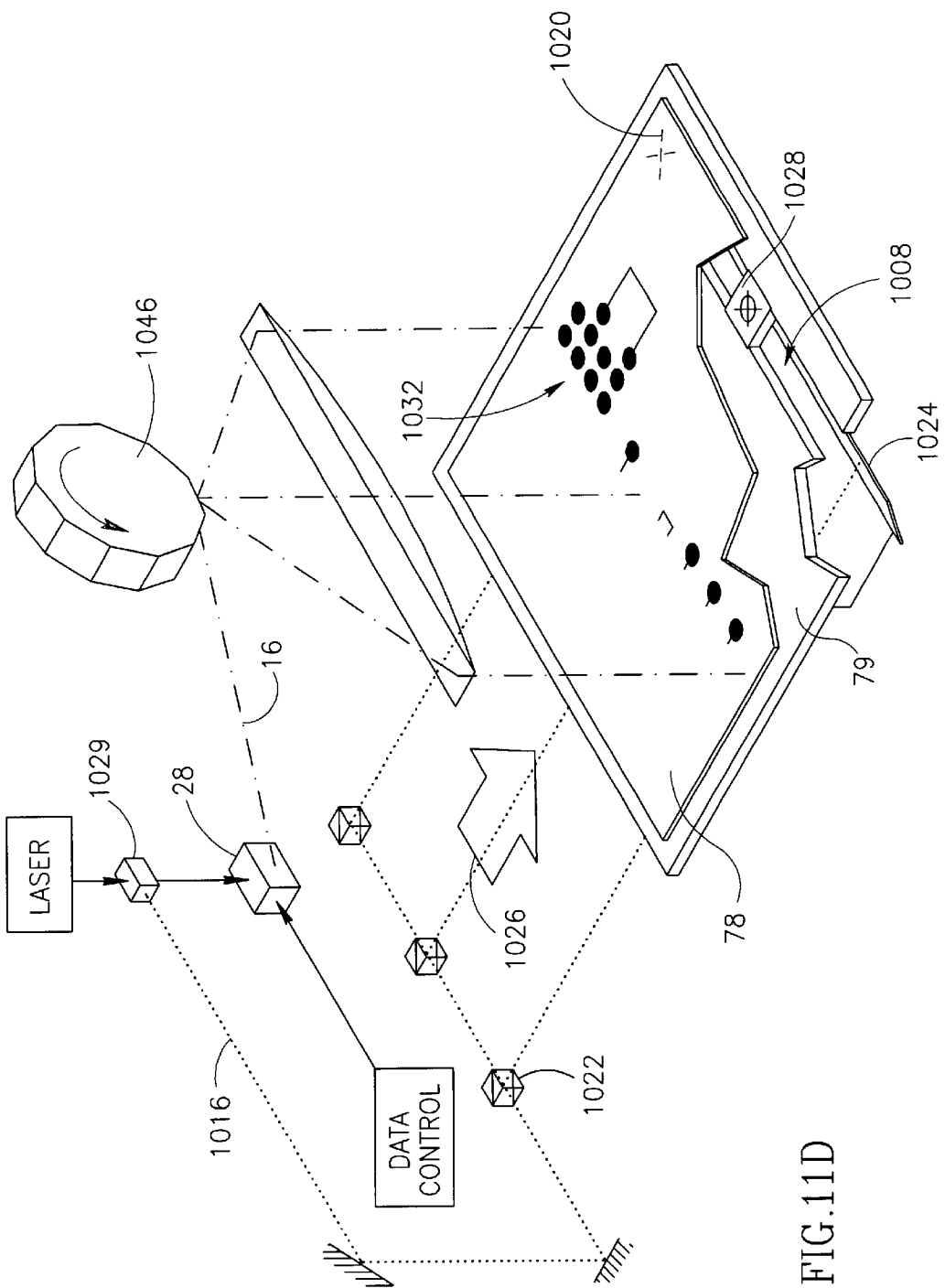

FIG. 11D shows still another exemplary embodiment of the invention for forming alignment patterns 1020 on the underside of board 78. The embodiment shown in FIG. 11D differs from the embodiment shown in FIG. 11C in that a laser beam portion 1016 is split off from the writing beam 16 of system 200, and laser beam portion 1016 is employed to expose a visible "latent" or "printout" image on the underside of board 78 while writing beam 16 scans an electrical circuit pattern on the top side of board 78.

As seen in FIG. 11D, table 79 is provided with a slit-like opening 1008. Board 78 at least partially overlays opening 1008. Any other suitable opening, such as a round or square hole is also suitable. A first stationary optical element 1022 is mounted in a fixed manner to the base of an image pattern recording system, such as system 200 (FIG. 3) and a second mirror 1024 is mounted to table 79 below slit 1008. Board 78 is suitably photosensitized at underside portions thereof which overlay slit 1008. As table 79 progresses in the direction of arrow 1026, beam 16 scans an electrical circuit pattern 1032 onto a top surface of board 78 via polygon 1046. Generally simultaneously with the scanning of pattern 1032, laser beam portion 1016 is split from beam 16 at a beam splitter 1029, prior to modulator 28, and is directed to mirror 1024 via element 1022 which is either a simple reflecting mirror or may be operative to split portion 1016 into several beamlets as seen in FIG. 11D. Beam portions 1016 to expose the photosensitized portion of the underside of board 78, for example through a reticule, or other suitable pattern mask 1028. It is appreciated that in the system seen in FIG. 11D, because beam portions 1016 are in a fixed position and are operative expose patterns 1020 during substantially the entire time that pattern 1032 is scanned, only a very small portion of beam 16 needs to be diverted.

Exposure of the photosensitized portion on the underside of board 78 forms a "latent" or "printout" image, which is visible without developing, resulting in alignment pattern 1020. It is appreciated that because of the longer optical path length of beam 16 to the underside of board 78, as compared to the top side thereof, beam spot 930 typically is defocused and the extent of defocusing changes as a function of the distance of table 79 from stationary mirror 1022.

Figure 12:
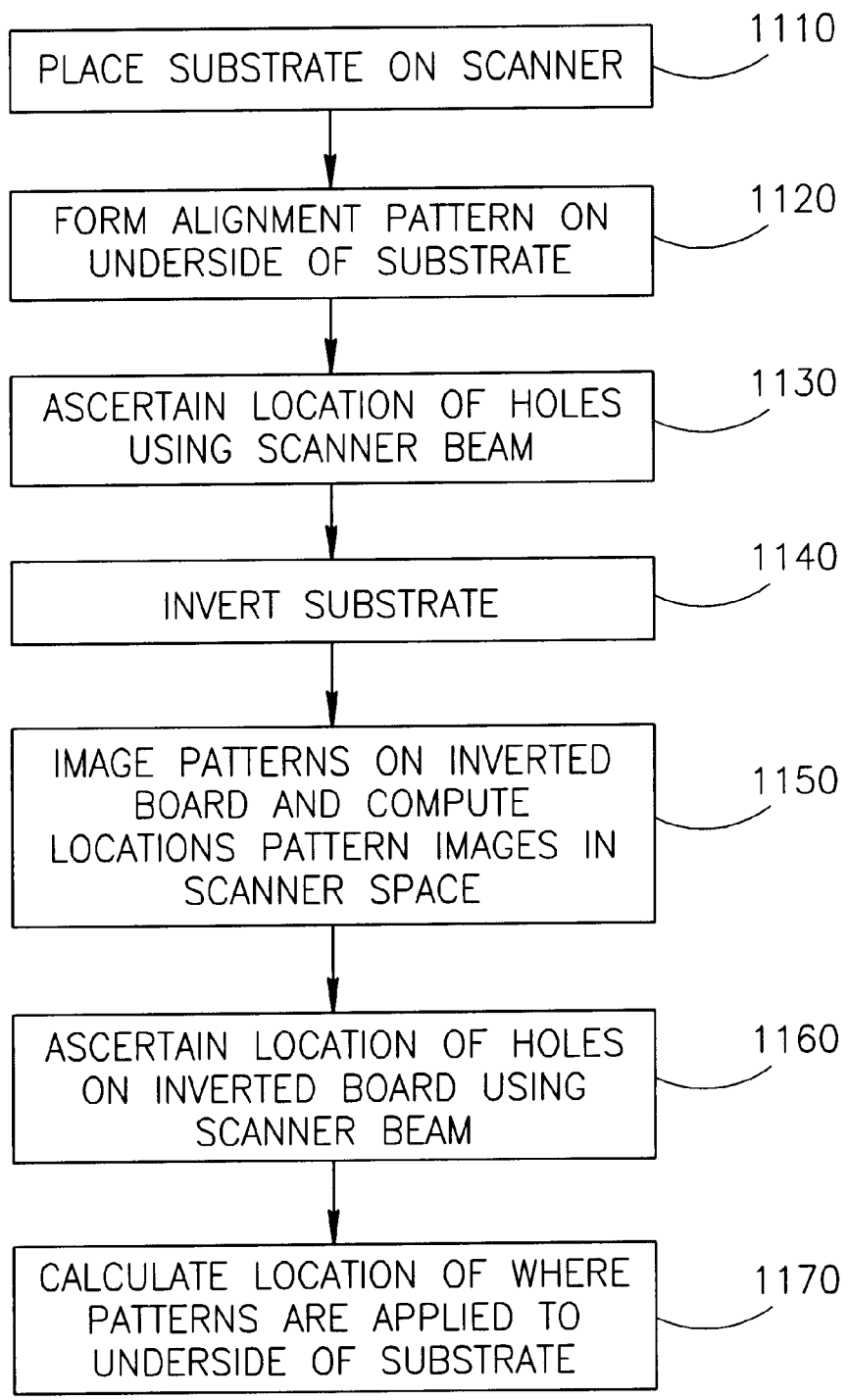
FIG. 12 is a simplified block diagram of an exemplary method for determining the location of a pattern on the underside of a printed circuit board.

Reference is made to FIG. 12 which is a simplified block diagram of an exemplary method for determining, in the coordinate system of an electrical circuit image pattern recorder, the location of a pattern, such as patterns 920 or 1020, or patterns formed by reticules 905 or 914, on the underside of board 78. The location determining function as described hereinbelow with reference to FIG. 12, employs a board 78 formed with holes 150, as seen in FIG. 2. Typically, board 78 is provided, at least on part of its underside, with a suitable photosensitive coating to form a visible "latent" image when selectively exposed by a suitable light beam.

A printed circuit board 78, provided with holes 150 and typically having a photosensitized region on at least part of the bottom surface thereof, is placed on a scanner system 200 (1110). A pattern, which may be a dimpled pattern, printed pattern or visible "latent" image pattern, is formed on the underside of board 78 (1120), for example as described with reference to any of FIGS. 11A–11D. Either before, during or after the formation of a pattern on the underside of board 78, the location of holes 150 in a board 78 (FIG. 4) in the coordinate system of a scanner system 200 is ascertained (1130) using beam 16 generally as known in the art. A suitable methods for determining the locations of holes 150 with beam 16 is described hereinabove with reference to FIG. 2 and in greater detail in PCT patent publication WO 00/02424.

Board 78 is then inverted (1140), and patterns formed on the underside of board 78 (which following inversion are now on top) are imaged using at least one imager 202. The locations of the patterns in the coordinate system of scanner 200 are now determined (1150). Determination of the locations of the patterns in the coordinate system of scanner 200 is based on an imager coordinate to scanner coordinate transform, calculated and stored in memory as described hereinabove.

Either before, during or after imaging of the patterns and calculation of the location of patterns in scanner system space performed in step 1150, the locations of holes 150 in the coordinate space of scanner system are ascertained using beam 16 (1160) generally as known in the art. A suitable methods for determining the locations of holes 150 with beam 16 is described hereinabove with reference to FIG. 2 and in greater detail in PCT patent publication WO 00/02424.

Using the knowledge of the location of holes in the coordinate system of scanner 200 both before and after inversion of board 78, as obtained in steps 1130 and 1160 respectively, and using the knowledge of the location of the images of the patterns after inversion in the coordinate system of scanner 200, as obtained in step 1150, the precise location, in the coordinate system of scanner 200, of where patterns are generated on the underside of board 78 are calculated (1170).

Figure 13:
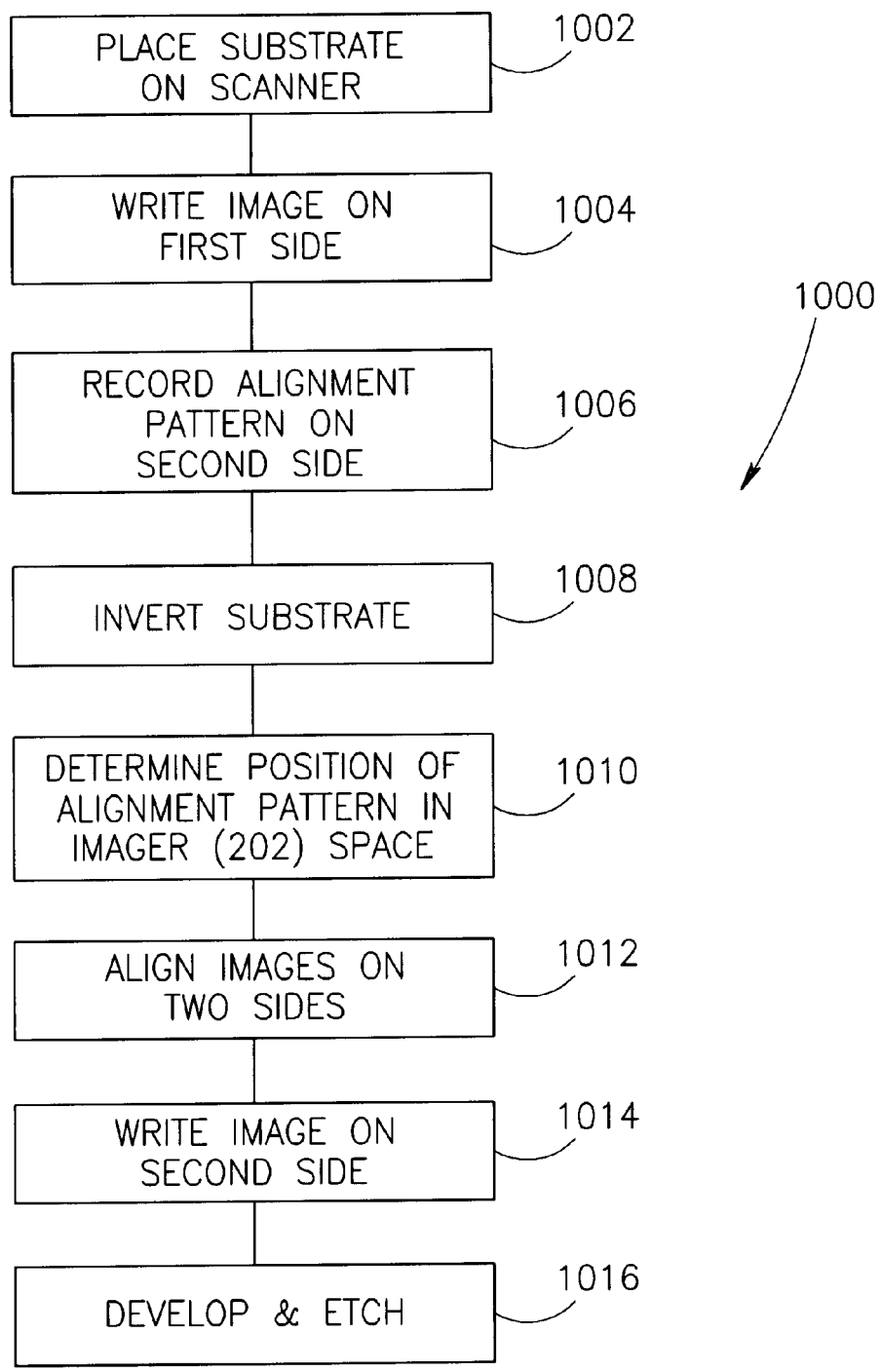
FIG. 13 is a simplified block diagram of a method of direct scanning of two sides of a printed circuit board, for example using the apparatus of FIGS. 11A–11D.

FIG. 13 is a block diagram of an exemplary method 1000 of printing aligned images on two sides of a printed circuit board utilizing any of the apparatus seen in FIGS. 11A–11D.

A printed circuit board substrate is placed on a system for recording an electrical circuit image pattern (1002). It is appreciated that scanner 200 (FIG. 3), provided with imagers disposed above table 79, may be used. The board 78 is preferably roughly aligned on scanner 200 by placing pins on the base into holes on substrate 200. An image, for example of an electrical circuit pattern, is recorded on the substrate board 78 (1004) by the scanner 200 and an alignment pattern, having a known spatial orientation relative to the image of an electrical circuit pattern, preferably simultaneously is recorded on the second side (1006). In exemplary embodiments of the invention, recordation of the alignment pattern is by mechanical marking or by exposing an image in accordance with any of the apparatus described with respect to FIGS. 11A–11D. If desired an additional alignment pattern may be formed on the first side of board 78 to redefine a transform between the imagers coordinate spaces and the scanner coordinate space. In exemplary embodiments of the invention, the transformations determined above with respect to FIGS. 5A–5C and FIG. 8, and the alignment pattern location function described with respect to FIG. 13 are used to provide the reference positions of alignment patterns in scanner system coordinate space so that electrical circuit patterns may be recorded on both sides of board 78 in a set spatial orientation with respect to the alignment patterns.

The substrate board 78 is inverted such that the other side of the substrate is available for imaging and scanning (1008). The alignment pattern is imaged by imagers 202 and the position of the alignment pattern in imager 202 space is transformed to determine a position of the alignment patterns in scanner 200 space (1010). The image to be formed on the second side of board 78 by the scanner 200 is aligned to the alignment pattern and thus to the image already formed on the first side, whose position was recorded in predetermined orientation with respect to the alignment pattern (1012). Apparatus for performing this alignment (which generally requires an x-y movement of the data and optionally angular rotation of board 78, typically performed by mechanical rotation of table 79.) Such alignment is shown as elements 156, 157, 158, 160 and 100 on FIG. 4.

A pattern is written on the second side of board 78 by the scanner (1014), as aligned in step 1012, and both sides of board 78 are developed and subsequently etched (1016) to form etched electrical circuit patterns on both sides of board 78.

The invention has been described utilizing exemplary apparatus and exemplary methods. It should be understood that other apparatus may be used in carrying out the methods and the methods described may be useful in apparatus that is different from that described. Furthermore, since each of the methods is, in great measure, a stand alone method, other methods may be utilized in determining one or more of the calibrations described. In particular, it may be possible, under certain circumstances, to delete or simplify one of the calibrations, as for example when the devices are produced to a very high tolerance or where very high accuracy is not needed. Furthermore, the acts indicated in the block diagrams may be combined or their order changed in ways that will occur to persons of the art, in order to achieve the same results.

In addition, while a system using two imagers has been described (for each side of the board, as applicable), a single imager may be used in one of two ways. In a first embodiment, the imager has a large enough field of view to encompass multiple patterns on the substrate. Generally, this embodiment will have a lower resolution and accuracy, but may be useful for some applications. A second method is to move the imager from position to position to image different patterns.

While the methods and apparatus described represent a "best mode" for carrying out the invention, it should be understood that some elements of the apparatus and claims may not be necessary for all embodiments of the invention and that elements of the various embodiments may be combined.

As used herein, the terms "have", "include" and "comprise" or their conjugates, as used herein mean "including but not necessarily limited to".

What is claimed is:

1. A method of recording aligned images on two sides of a printed circuit board substrate, comprising:

recording an image of an electrical circuit pattern on a first side of a printed circuit board substrate;

forming an alignment pattern on a side of the printed circuit board substrate, wherein said alignment pattern has a known spatial relationship to said image of an electrical circuit pattern;

determining a location of the alignment pattern on the printed circuit board substrate; and recording an image of an electrical circuit pattern on a second side of the printed circuit board substrate in response to the determined location of the alignment pattern.

2. A method according to claim 1 wherein determining includes imaging the alignment pattern with at least one imager.

3. A method according to claim 1 wherein forming an alignment pattern on a side of the printed circuit board substrate includes forming the alignment pattern on the first side of the printed circuit board substrate.

4. A method according to claim 1 wherein forming an alignment pattern on a side of the printed circuit board substrate includes forming the alignment pattern on the second side of the printed circuit board substrate.

5. A method according to claim 1 wherein forming an alignment pattern on a side of the printed circuit board substrate includes forming the alignment pattern at least partially simultaneously while said image of an electrical circuit pattern is being recorded.

6. A method according to claim 1 wherein forming an alignment pattern on a side of the printed circuit board substrate comprises:

providing a photosensitive coating that is formulated to produce a visible image when exposed to light of a predetermined wavelength; and selectively exposing said photosensitive coating with light of said predetermined wavelength.

7. A method according to claim 6 wherein said photosensitive coating is a photoresist applied to a surface of said printed circuit board substrate.

8. A method according to claim 6 wherein said photosensitive coating is a photosensitive label applied to a surface of said printed circuit board substrate.

9. A method according to claim 1 wherein forming an alignment pattern comprises providing a physical marking on said printed circuit board substrate.

10. A method according to claim 6 wherein selectively exposing comprises selectively exposing using a light source different from a light source used to record said image of an electrical circuit pattern.

11. A method according to claim 10 wherein said light source provides patterned light to said second side of the printed circuit board while the image on the first side is being recorded.

12. A method according to claim 6 wherein selectively exposing comprises selectively exposing said photosensitive coating with light provided by light beam that is employed to record at least part of an electrical circuit image pattern on printed circuit board substrate.

13. A method according to claim 6 wherein selectively exposing comprises exposing said photosensitive surface through a mask.

14. A method according to claim 12 wherein said alignment pattern is formed while the first side is in an orientation in which the image thereon is written.

15. A method according to claim 14 wherein the alignment pattern is formed on said second side.

16. A method according to claim 6 wherein selectively exposing comprises selectively exposing said photosensitive coating with light provided by light beam split off from said light beam that is employed to record at least part of an electrical circuit image pattern on printed circuit board substrate.

17. A method according to claim 16 wherein said alignment pattern is formed while the first side is in an orientation in which the image thereon is written.

18. A method according to claim 17 wherein the alignment pattern is formed on said second side.

19. A method according to claim 18 wherein the alignment pattern is formed simultaneously with the image.

20. A method according to claim 6 wherein said predetermined wavelength is in the UV spectrum.

21. A method according to claim 1 wherein said recording an image of an electrical circuit pattern includes:

providing said printed circuit board substrate coated with a photosensitive coating; and scanning said printed circuit board substrate coated with a photosensitive coating with a modulated laser beam.

22. A method according to claim 21 wherein determining a location comprises:

determining a relationship between a coordinate system of a system for recording an image of an electrical circuit pattern and a coordinate system of an imager for viewing a side of said printed circuit board substrate board;

determining a location of the alignment pattern in the coordinate system of said imager; and determining a location of the alignment pattern in the coordinate system of said system for recording an image of an electrical circuit pattern in response to said relationship.

23. A method according to claim 4 wherein determining a location of the alignment pattern formed on the second side of the printed circuit board substrate comprises:

recording a visible alignment pattern on a second side of a substrate;

determining a spatial relationship between said visible alignment pattern and a location addressed by a pattern recording system;

inverting said substrate;

determining a post inversion position of said location addressed by said pattern recording system;

imaging said visible alignment pattern with an imager to determine a post inversion position of said visible alignment pattern;

calculating the position of said alignment pattern in response to indications of said location, said post-inversion position of said location and said post inversion position of said alignment pattern.

24. A method according to claim 23 wherein determining the first spatial relationship comprises determining the location of at least one hole formed in a substrate.

25. A method according to claim 1 wherein the at least one imager comprises a single imager.

26. A method according to claim 1 wherein the at least one imager comprises a plurality of imagers.

27. A method according to claim 1 wherein the at least one imager is fixed in position.

28. A method according claim 1 wherein the at least one imager is moveable and including means for determining its position.

29. A method for determining a position whereat a pattern is formed on a first side of a substrate relative to a position on a second side of the substrate, comprising:

forming a pattern on a first side of a substrate;

determining a position of at least one location on a substrate when said substrate is in a first spatial orientation at which the pattern is formed on the first side of the substrate;

inverting said substrate;

determining a position of said at least one location when said substrate is inverted:

sensing a position of said pattern when said substrate is inverted; and calculating the position of said pattern on said first side of said substrate in response to inputs including: the position of said location when said substrate is in said first orientation, the position of said location when said substrate is inverted, and the position of said pattern when said substrate is inverted.

30. A method according to claim 29 wherein said forming includes exposing a pattern in a photosensitive coating disposed on said substrate.

31. A method according to claim 30 wherein said pattern is visible without developing said photosensitive coating.

32. A method according to claim 29 wherein said location is a hole in said substrate.

33. A method according to claim 32 wherein said determining a position of said at least one location includes addressing said location with a beam of light;

sensing the presence of the beam of light at said address; and determining the position of the beam of light at said address.

34. A method according to claim 29 wherein said sensing includes imaging said pattern with an imager.

35. Apparatus for forming an images on first and second sides of a printed circuit board substrate, comprising:

a scanner adapted to form a first image of an electrical circuit pattern on a first side of the substrate when the substrate is placed thereon in a first orientation;

means for forming an alignment pattern on the first side or the second side, said alignment pattern having a known spatial relationship to said electrical circuit pattern;

an imager that views the alignment pattern when the substrate is inverted and generates an alignment pattern image information; and a controller that receives the alignment pattern image information and controls the scanner to form a second image on the second side, said second image being aligned with said first image, by the controller, responsive to the alignment pattern image information.

36. Apparatus according to claim 35 wherein the imager views the first side of the substrate when the substrate is in the first orientation.

37. Apparatus according to claim 36 wherein the alignment pattern is formed on the second side of the substrate, when the substrate is in the first orientation.

38. Apparatus according to claim 37 and including an optical system that directs light from the scanner to the second side to form the alignment pattern.

39. Apparatus according to claim 37 and including a source of radiation positioned and operative to irradiate the second side with patterned light.

40. Apparatus according to claim 35 wherein the imager views the second side of the substrate when the substrate is in the first position.

41. Apparatus according to claim 40 wherein the alignment pattern is written on the first side of the substrate, when the substrate is in the first orientation.

42. Apparatus according to claim 41 wherein the controller controls the scanner to write the alignment pattern on the first side.

43. Apparatus according to claim 35 and including a memory in which a relationship between a coordinate system of the imager and a coordinate system of the scanner is recorded, said relationship being utilized by the controller to control the alignment of the second image.

44. Apparatus according to claim 39 and including a memory in which a spatial relationship between the patterned light generator and the coordinate system of the imager is recorded, said relationship being utilized by the controller to control the alignment of the second image.

45. Apparatus according to claim 39 and including a memory in which a spatial relationship between the patterned light generator and the coordinate system of the scanner is recorded, said relationship being utilized by the controller to control the alignment of the second image.

46. A method for forming an images on first and second sides of a printed circuit board substrate, comprising:

recording a first image of an electrical circuit pattern on a first side of the substrate, by scanning, when the substrate is in a first orientation;

forming an alignment pattern on the first side or the second side, said alignment pattern having a known spatial relationship to said electrical circuit pattern;

inverting the substrate;

imaging the alignment pattern when the substrate is inverted and generating alignment pattern image information;

determining a position and orientation for scanning a pattern to record a second electrical circuit pattern on the second side, at which the position and orientation the first and second electric circuit patterns are aligned, responsive to the known spatial relationship and the alignment pattern information;

recording a second image of an electrical circuit pattern on the second side, by scanning, responsive to said determination.

* * * * *